United States Patent
Thies et al.

(10) Patent No.: US 7,468,306 B2
(45) Date of Patent: Dec. 23, 2008

(54) METHOD OF MANUFACTURING A SEMICONDUCTOR DEVICE

(75) Inventors: Andreas Thies, Berlin (DE); Klaus Muemmler, Dresden (DE)

(73) Assignee: Qimonds AG, Munich (DE)

( * ) Notice: Subject to any disclaimer, the term of this patent is extended or adjusted under 35 U.S.C. 154(b) by 429 days.

(21) Appl. No.: 11/139,975

(22) Filed: May 31, 2005

(65) Prior Publication Data
US 2006/0267139 A1   Nov. 30, 2006

(51) Int. Cl.
*H01L 21/20* (2006.01)
(52) U.S. Cl. .................. 438/396; 438/386; 438/398; 438/397; 257/301; 257/E21.018
(58) Field of Classification Search .......... 257/E27.048, 257/E21.008, E21.647, 537, 301, E21.507, 257/E21.018, E21.019; 438/239, 253, 261, 438/294, 396–398, 626–640, 386
See application file for complete search history.

(56) References Cited

U.S. PATENT DOCUMENTS

| | | | | |
|---|---|---|---|---|
| 6,177,351 | B1 * | 1/2001 | Beratan et al. | 438/694 |
| 6,437,385 | B1 * | 8/2002 | Bertin et al. | 257/301 |
| 6,767,788 | B2 * | 7/2004 | Kim | 438/253 |
| 6,946,357 | B2 * | 9/2005 | Sandhu et al. | 438/386 |
| 2003/0064557 | A1 * | 4/2003 | Juengling | 438/200 |
| 2003/0087501 | A1 * | 5/2003 | Park | 438/396 |
| 2003/0155626 | A1 * | 8/2003 | Ireland et al. | 257/437 |
| 2004/0214402 | A1 * | 10/2004 | Seo | 438/396 |
| 2005/0026361 | A1 * | 2/2005 | Graettinger et al. | 438/253 |
| 2005/0215002 | A1 * | 9/2005 | Violette | 438/222 |
| 2006/0115978 | A1 * | 6/2006 | Specht et al. | 438/637 |
| 2006/0160300 | A1 * | 7/2006 | Weis | 438/250 |
| 2006/0267139 | A1 * | 11/2006 | Thies et al. | 257/532 |

FOREIGN PATENT DOCUMENTS

TW         296484 A  *  1/1997

* cited by examiner

*Primary Examiner*—Carl Whitehead, Jr.
*Assistant Examiner*—Latanya Crawford
(74) *Attorney, Agent, or Firm*—Eschweiler & Associates, LLC

(57) ABSTRACT

A semiconductor substrate is provided comprising a plurality of contact pads arranged on a horizontal surface of the semiconductor substrate. Pillars of a first sacrificial material are formed on the contact pads. A first dielectric layer is deposited thus covering at least said pillars. A first conductive layer is deposited between said pillars covered with the first dielectric layer. The pillars are removed thus providing trenches in the first conductive layer having walls covered with the dielectric layer. A second conductive layer is deposited on the first dielectric layer in the trench. A second dielectric layer is deposited such that at least the second conductive layer in the trench is covered by the second dielectric layer. A third conductive layer is deposited on the second dielectric layer.

22 Claims, 19 Drawing Sheets

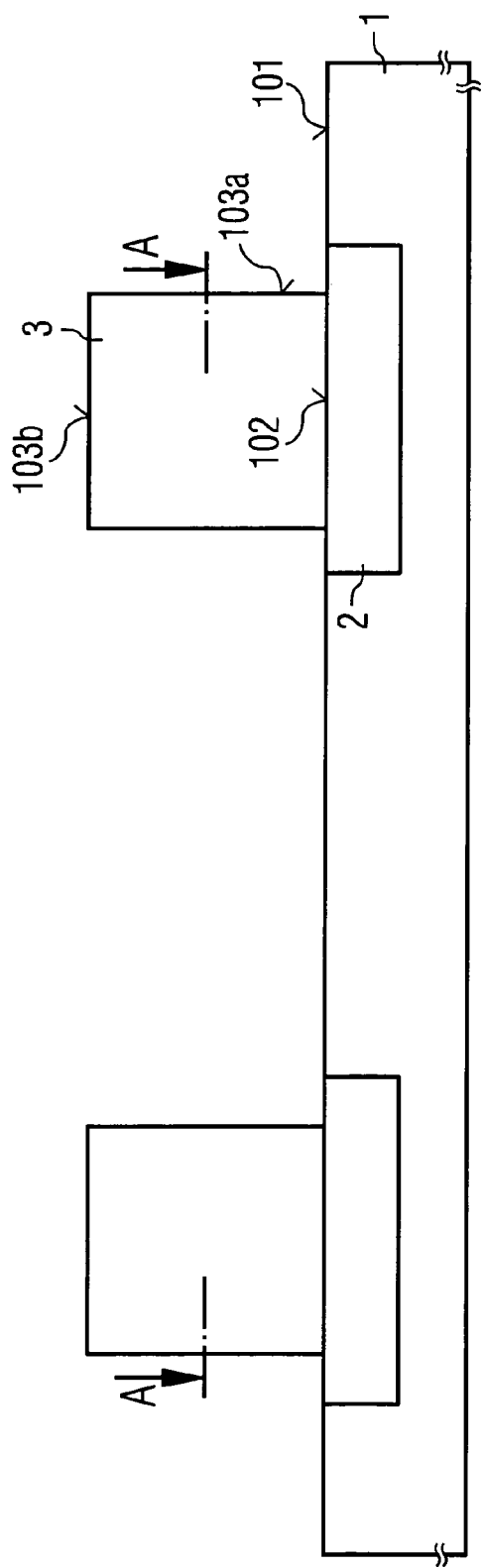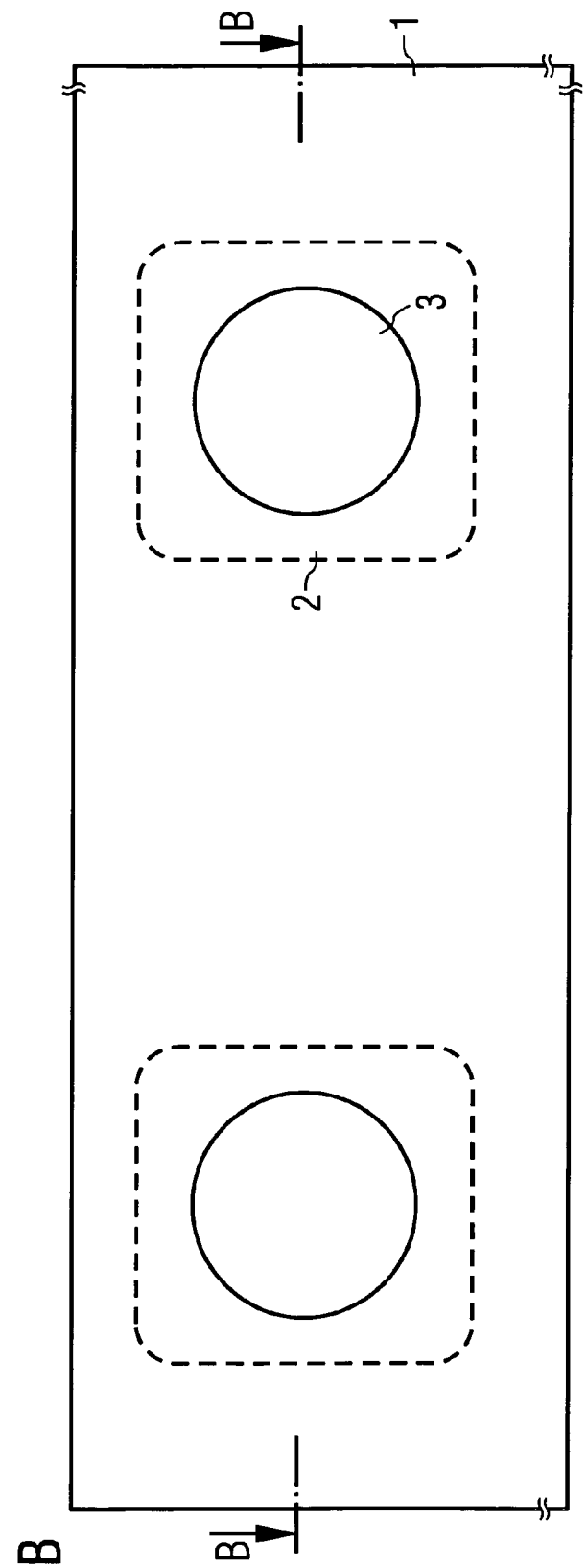
FIG 3A
FIG 3B

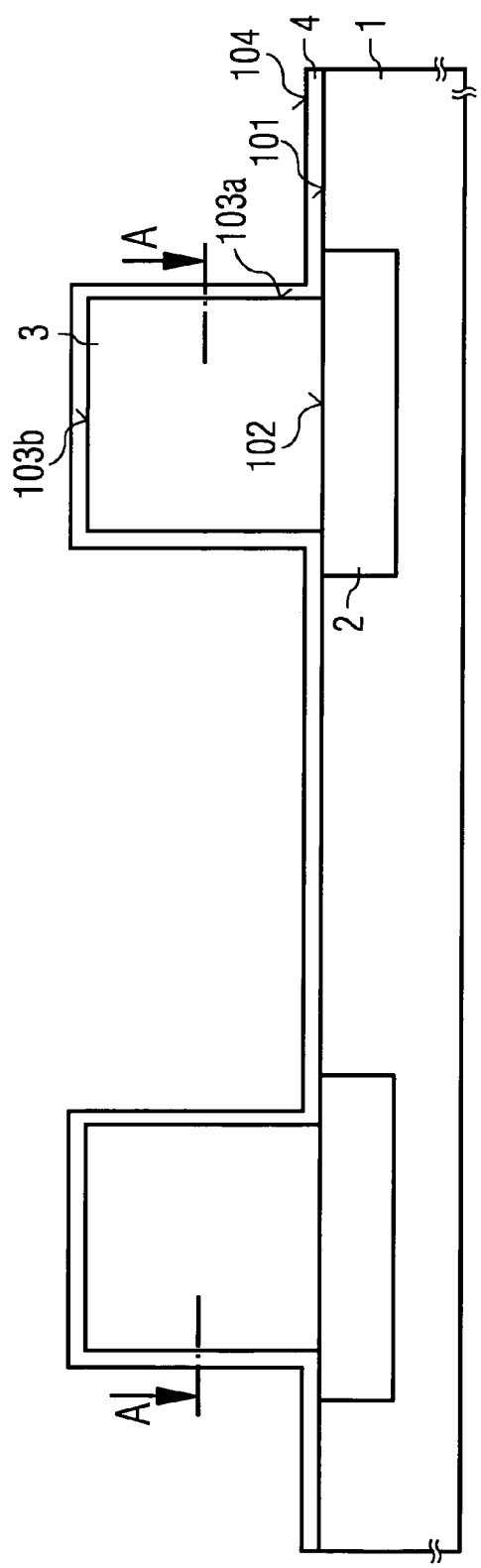
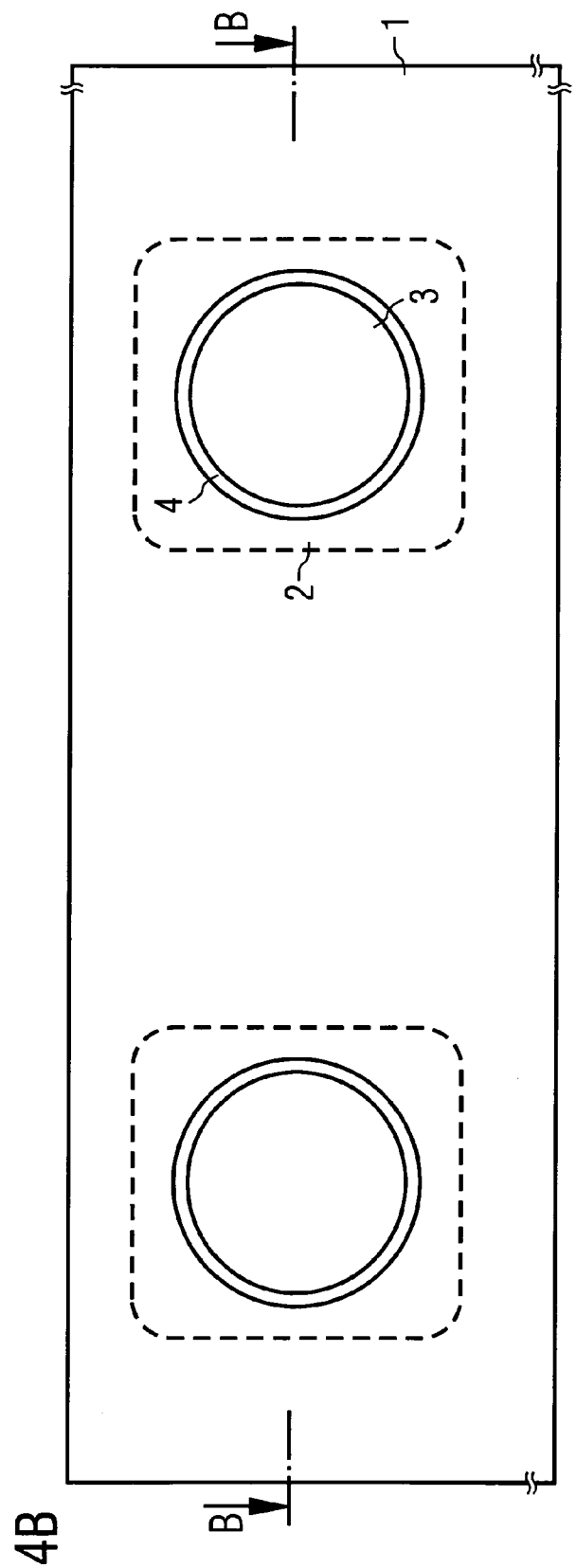
FIG 4A
FIG 4B

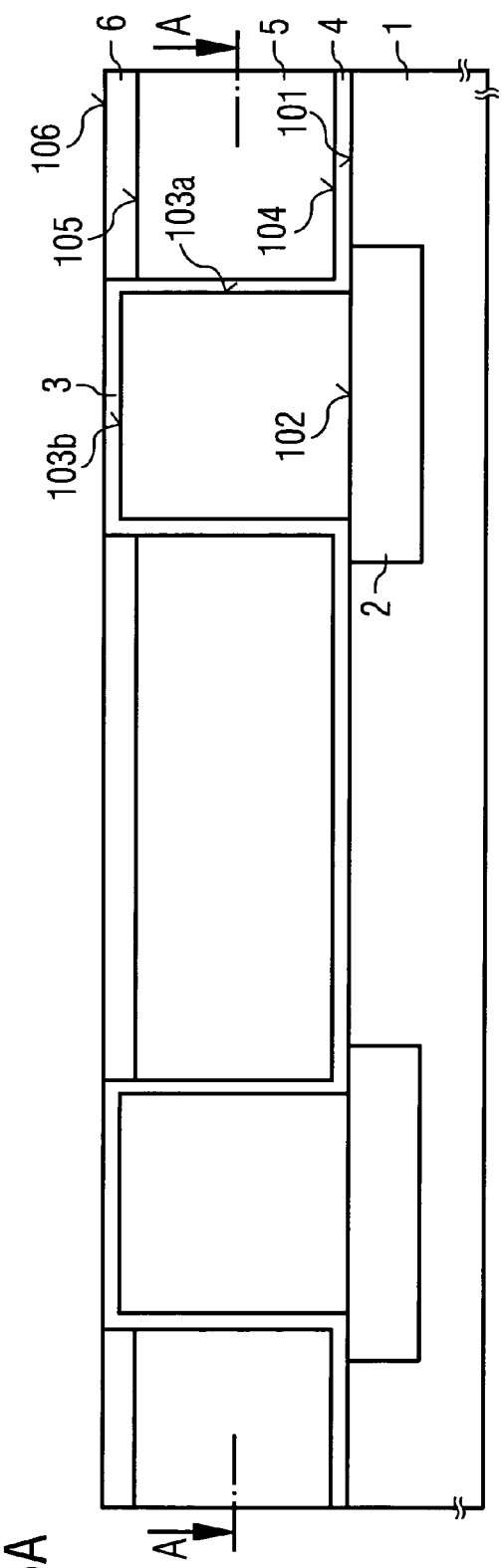
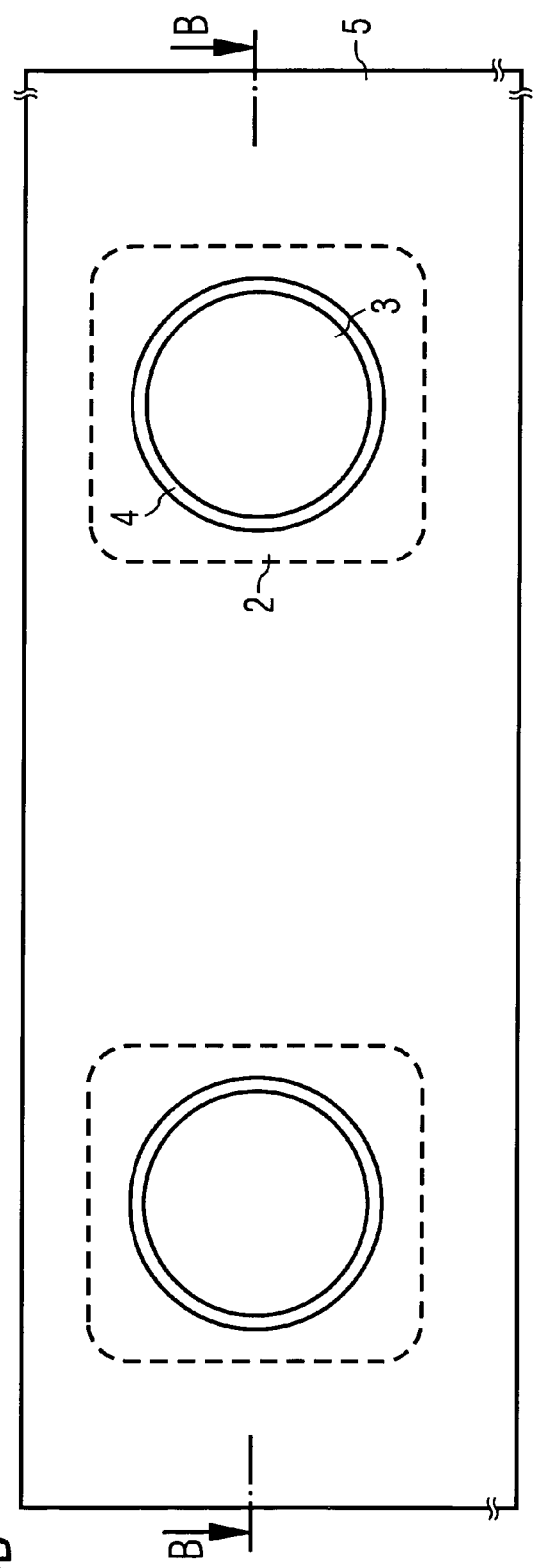
FIG 5A
FIG 5B

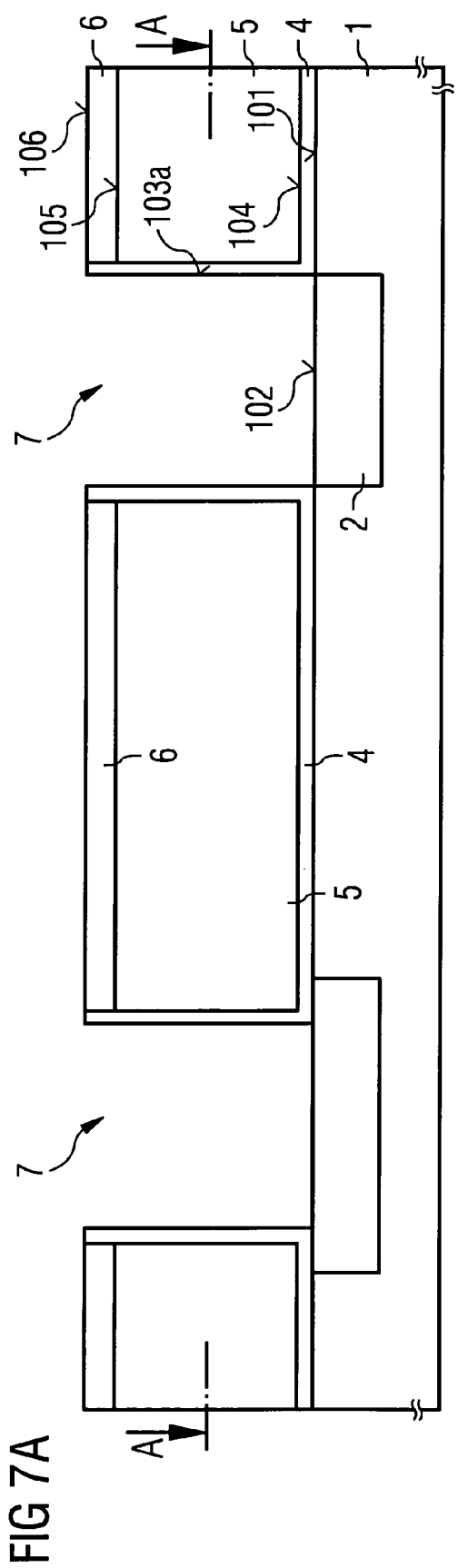
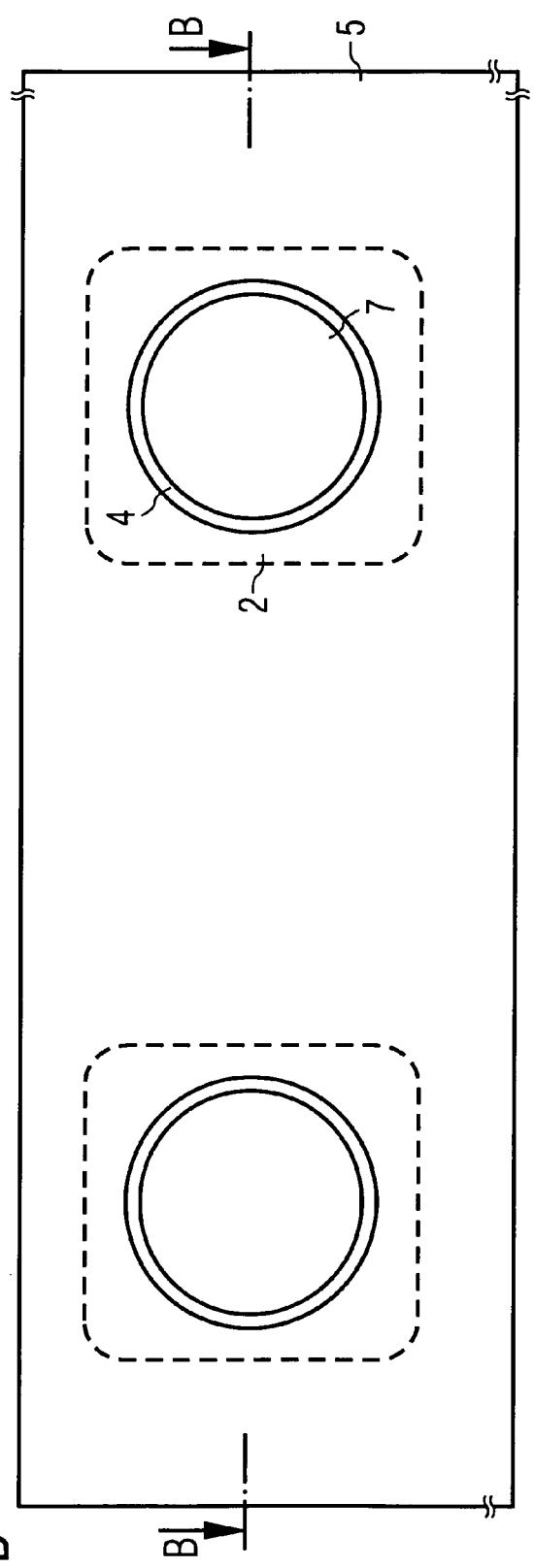
FIG 7A
FIG 7B

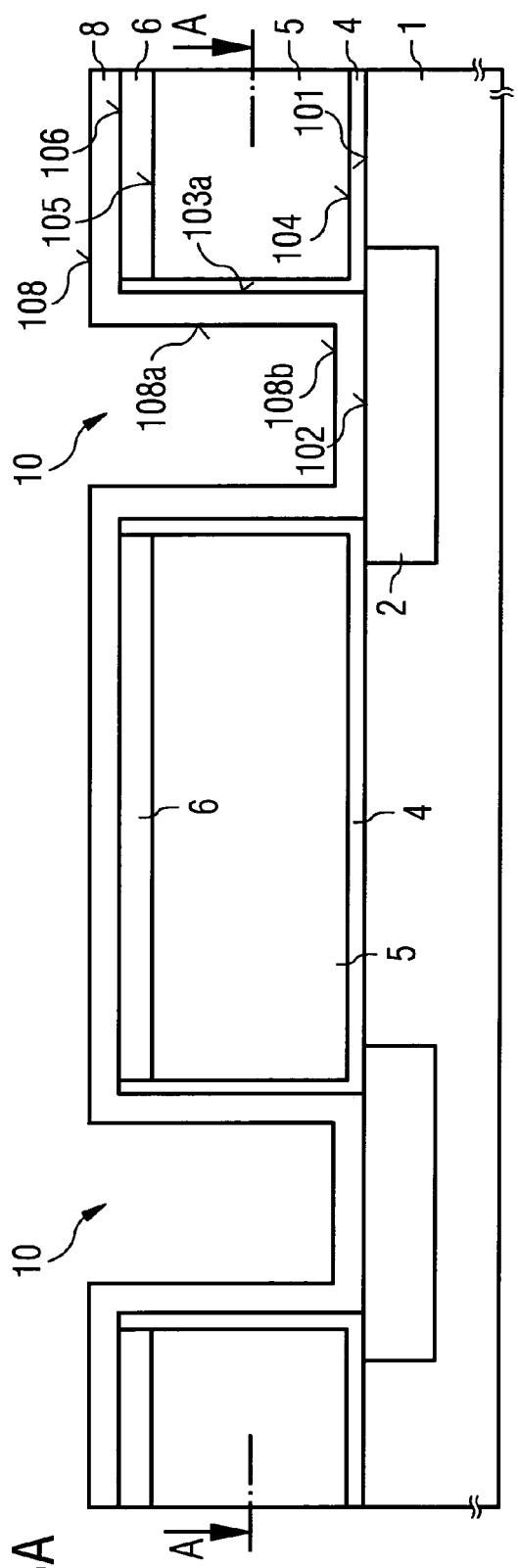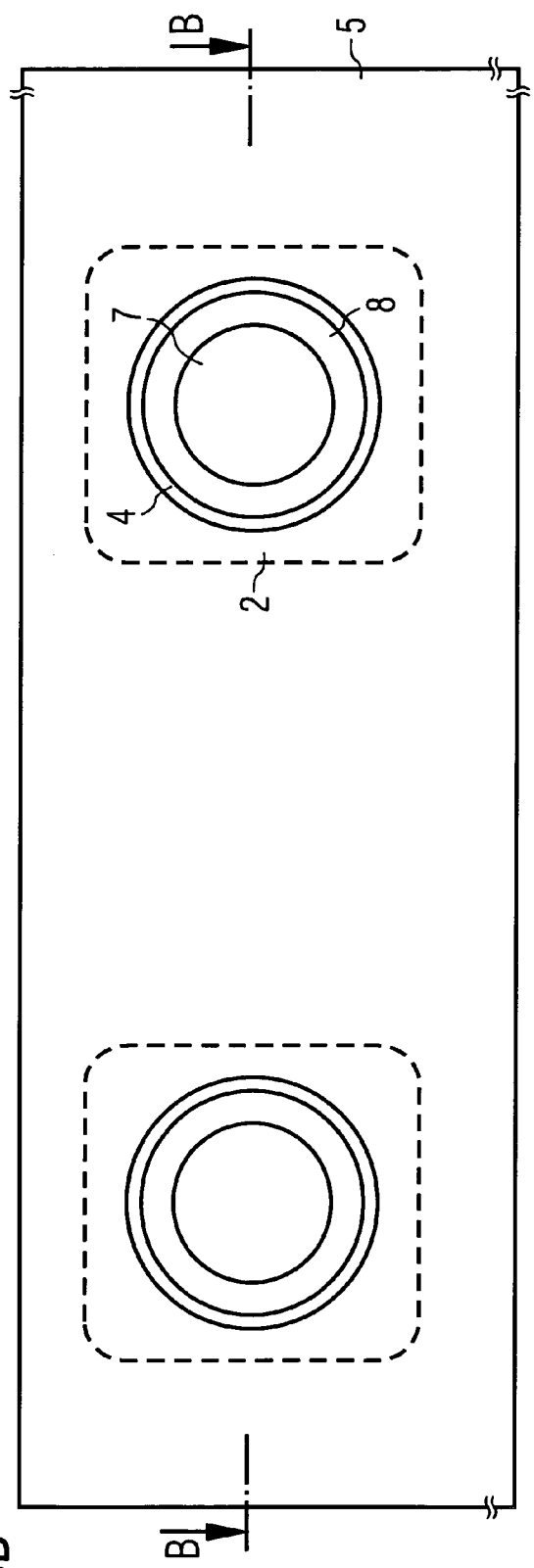
FIG 8A
FIG 8B

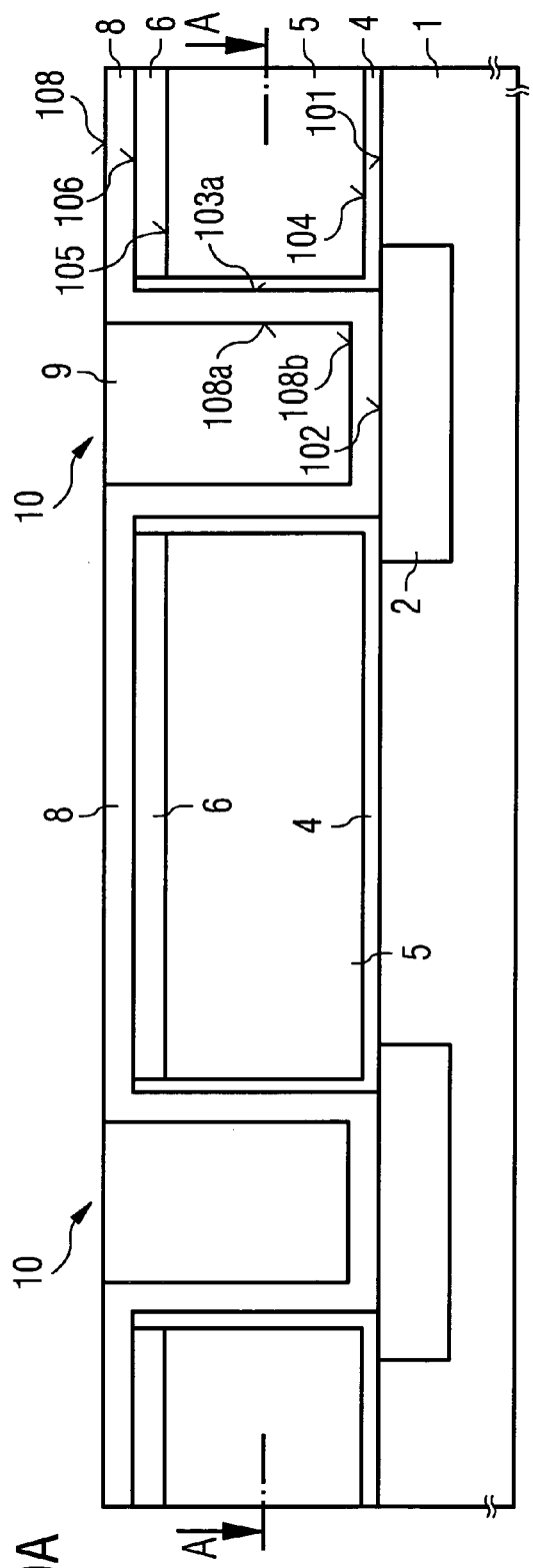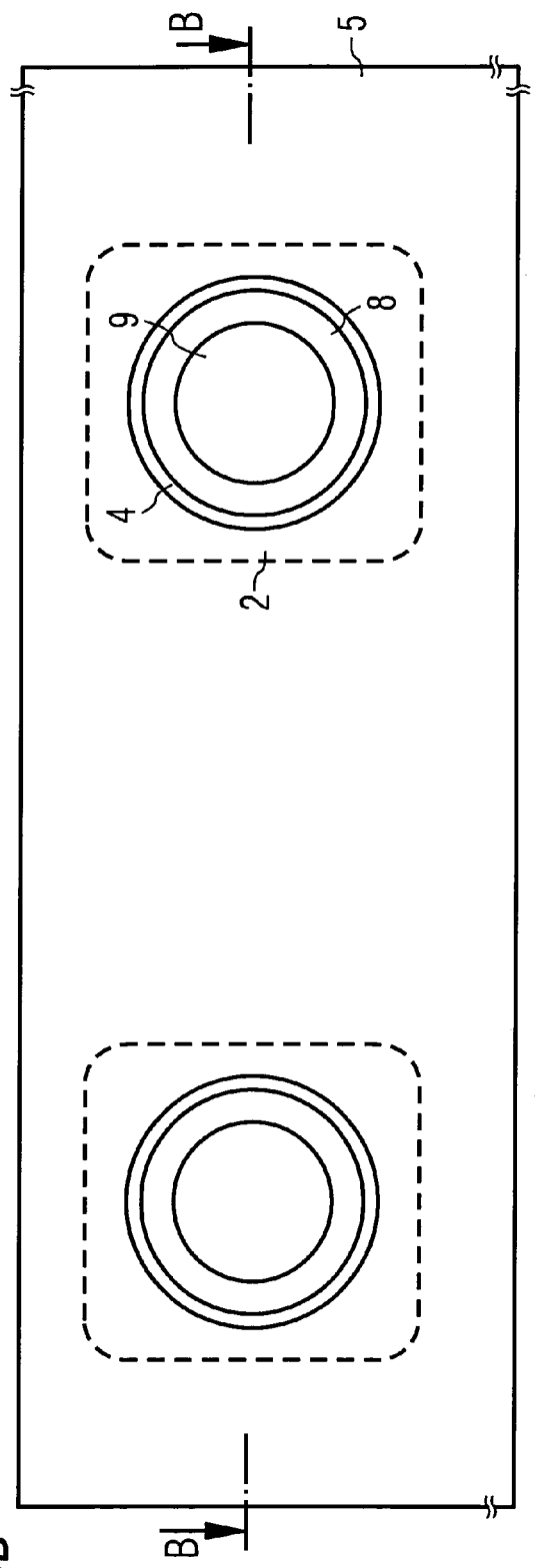
FIG 9A
FIG 9B

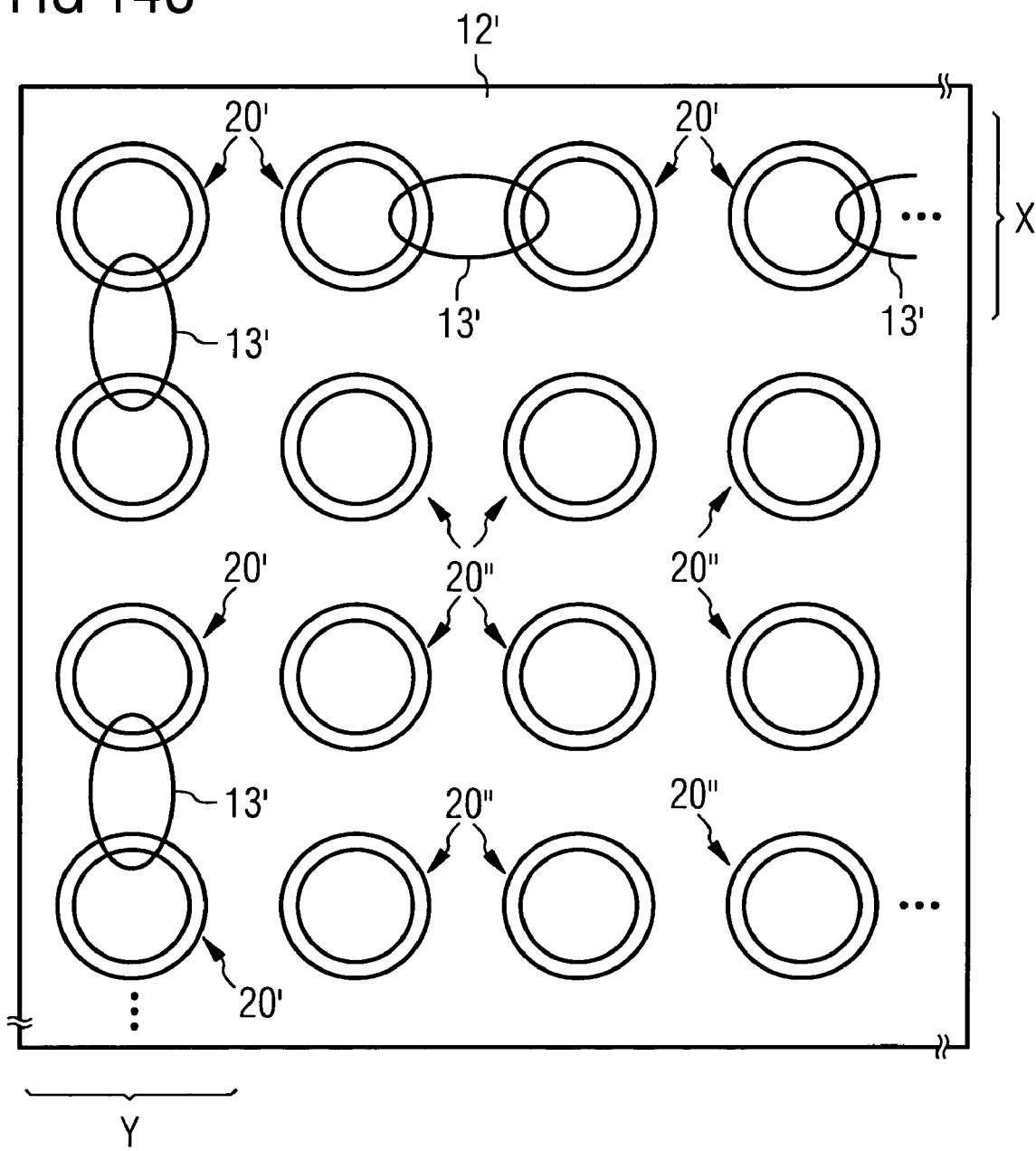

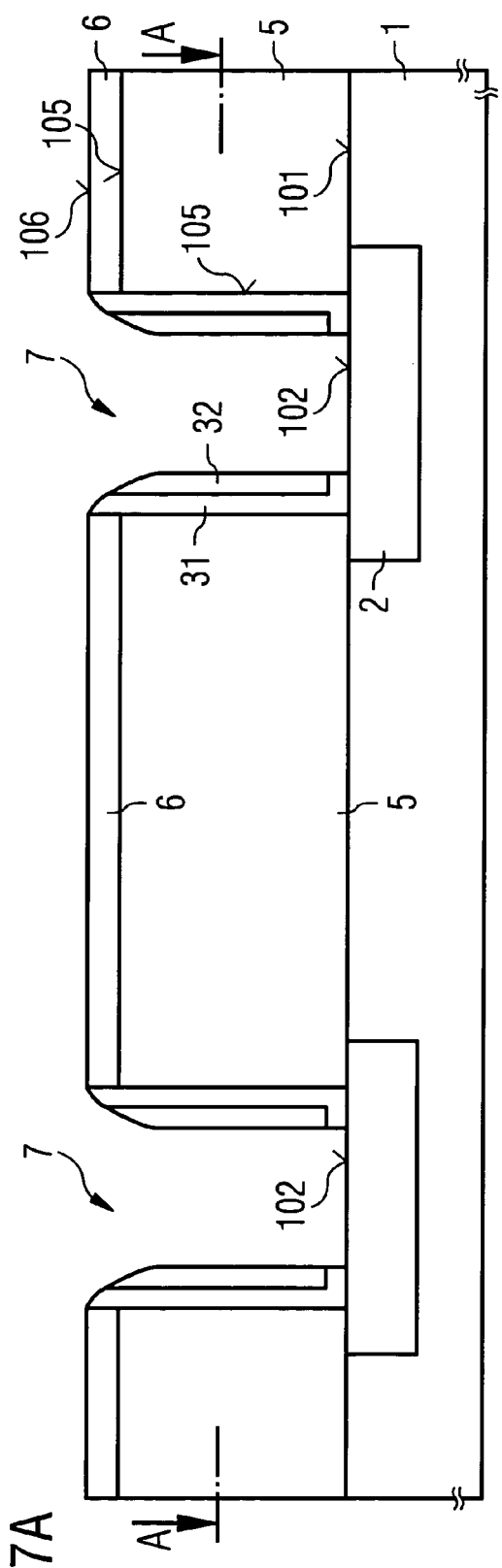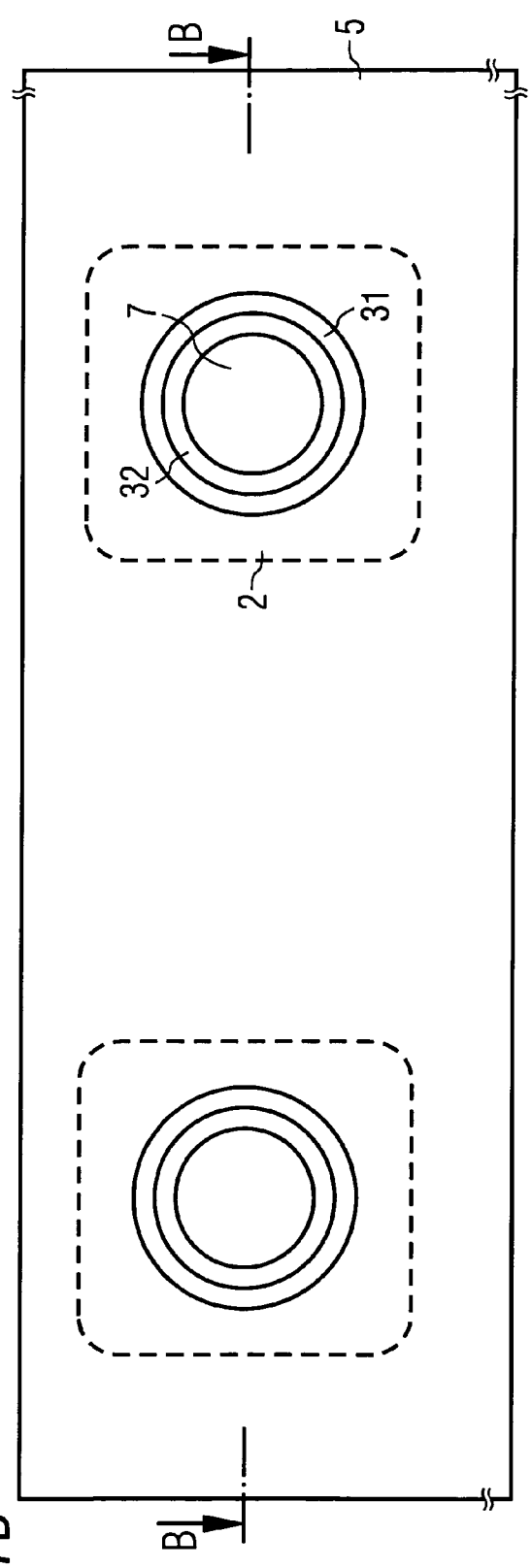

METHOD OF MANUFACTURING A SEMICONDUCTOR DEVICE

TECHNICAL FIELD OF THE INVENTION

The present invention relates to a method and device for manufacturing a semiconductor device, and in particular to a semiconductor device having a plurality of double sided capacitors, and a semiconductor device and fabrication method.

BACKGROUND OF THE INVENTION

Although the invention in principle can be applied to any semiconductor device, the invention and its underlying problem hereinafter will be explained with regard to double sided capacitors used in memory devices.

A typical memory device comprises a plurality of memory cells which each consists of a single transistor and a storage capacitor. Information is stored as electric charges within the storage capacitor and may be accessed through the transistor. The transistor itself is addressable via bit lines and word lines. In order to increase the number of memory cells on a reasonable chip area lateral dimensions of the transistor and the storage capacitor has to be reduced.

The storage capacitor must be able to store a minimal amount of charge for a reliable operation of the memory cell. The charge which may be stored in a capacitor essentially depends on the size of the capacitor electrodes. Therefore, sufficiently large capacitor plates must be provided despite a reduction of the lateral structure sizes of the memory cells.

U.S. Pat. No. 6,507,064 B1 discloses a double sided capacitor having a cup shaped first electrode which inner and outer surfaces are covered by a dielectric layer on which a second electrode is deposited. Thus the size of the capacitor plate is defined by the inner and outer surfaces of the first electrode.

The method of manufacturing these double sided capacitors includes steps wherein the first electrode stands freely without mechanical support during at least one manufacturing step. A common problem is that tips of these free standing first electrodes can come into close contact and then stick together permanently. Therefore, additional structures must be provided between neighbouring first electrodes in order to avoid such contacts during a manufacturing process. The formation of these additional structures increases the complexity of the manufacturing process of the capacitor. Further, the additional structures are covering at least a part of the outer surfaces of the first electrode thus reducing the surface of the capacitor plates.

SUMMARY OF THE INVENTION

Accordingly, the present invention provides an improved method of manufacturing a semiconductor device having a plurality of double sided capacitors.

In one embodiment of the invention, there is a semiconductor substrate comprises a plurality of contact pads arranged on a first surface of the semiconductor substrate. Pillars of a first sacrificial material are formed at least on the contact pads, wherein the pillars are vertically protruding from the contact pads. A first dielectric layer is deposited to cover at least said pillars. A first conductive layer is deposited, at least partially, filling an area between said pillars covered with the first dielectric layer. The pillars are removed to provide trenches arranged in the first conductive layer having walls provided by said dielectric layer. A second conductive layer is deposited on said first dielectric layer at least in the trench. A second dielectric layer is deposited such that at least the second conductive layer in the trench is covered by the second dielectric layer. A third conductive layer is deposited at least on the second dielectric layer.

In another embodiment of the invention, there is a semiconductor device including a plurality of contact pads provided on a surface of a semiconductor substrate, addressable electrodes in cylindrical shape or cup shape having inner and outer surfaces, arranged on the contact pads, a dielectric layer covering inner and outer surfaces of the addressable electrodes, a first common electrode arranged on the surface of the semiconductor substrate contacting the dielectric layer covering said outer surface of the addressable electrode, a second common electrode arranged within the addressable electrode contacting the dielectric layer covering the inner surface of the addressable electrode, and on top of the first common electrode.

In one embodiment of the present invention, a mechanical support of the first electrode is provided at its outer surface by a first part of the common electrode (first common electrode). The formation of the first common electrode includes two essential steps: forming pillars in order to define sidewalls of the first common electrode and filling areas or gaps between pillars with a first conductive material thus forming the first common electrode. The deposition of conductive materials, for example doped silicon, needs high temperatures typically above 1000° C. and a deposition rate is in general lower then 0,5 μm per hour. Thus a deposition of a massive layer of 2 μm would severely affect a semiconductor device due to a high thermal stress. By the inventive method a time of deposition and thermal stress is significantly reduced since only a gap between the pillars needs to be filled.

The first dielectric layer has the purpose to isolate the first common electrode from the addressable electrode, i.e. the second conductive layer, and the contact pad, but not to isolate the contact pads from the addressable electrode, i.e. the second conductive layer. The dielectric layer is deposited before the first conductive layer is deposited. Thus the space occupied by the pillar, in which the addressable electrode will be provided, is electrically isolated from the first conductive layer. Further, the inventive method shields the contact pads against a deposition of the first dielectric layer by the pillars. Therefore, advantageously, no etching step is necessary to open the first dielectric layer in the area of the contact pads. Problems arising with etching steps are avoided, e.g. an parasitic etching of the first dielectric layer at the side walls and thus providing an electrical contact of the common electrode with the addressable electrode.

In one aspect of the method of manufacturing the semiconductor device, a semiconductor substrate is provided comprising a plurality of contact pads arranged on a first surface of said semiconductor substrate. Pillars of a first sacrificial material are formed at least on the contact pads, wherein the pillars are vertically protruding from the contact pads. A first conductive layer is deposited, at least partially, filling an area between said pillars covered with a non-conductive layer. The pillars are removed to provide trenches arranged in the first conductive layer having walls provided by said first conductive layer. A first dielectric layer and a protective conductive layer are deposited. Horizontal parts of the protective conductive layer and the first dielectric layer are removed by a liner etch process.

A second conductive layer is deposited on said first dielectric layer at least in the trench. A second dielectric layer is deposited such that at least the second conductive layer in the trench is covered by the second dielectric layer. A third conductive layer is deposited at least on the second dielectric layer.

According to a preferred embodiment, the pillars are removed by an etch process. The sacrificial material may comprise amorphous silicon.

A refinement applies a chemical mechanical polishing after depositing the second conductive layer to remove said second conductive layer arranged above the first conductive material.

A particular preferred embodiment forms at least one conductive plug formed through at least the second dielectric layer the conductive plug connecting vertically the first conductive layer and the third conductive layer.

According to still another embodiment, the conductive plug is formed above an area between two exterior contact pads of the plurality of contact pads.

A preferred embodiment forms the conductive plug with an elliptical horizontal cross section and an trapezoid vertical cross section. The elliptical or elongated shape allows a smaller lateral dimension then a circular shaped conductive plug.

According to another embodiment, the conductive plug connects the first, the second and the third conductive layers.

A preferred embodiment of the present invention forms the pillar by forming an oxide on the surface of the semiconductor substrate, forming trenches into the oxide such that the contact pads are at least partially exhibited, filling the trenches with the sacrificial material, and removing the oxide. Advantageously, the oxide may be applied to the semiconductor with a low thermal stress. The sacrificial material only needs to fill the gaps and thus does not significantly contribute to the thermal budget of the manufacturing process. Further, just one mask is needed to define the openings in the oxide and any further steps are all self-aligned. A highly selective etch process may be used to remove the oxide.

According to still another embodiment, the sacrificial material is applied on the surface of the semiconductor substrate and the sacrificial material is patterned by a lithographic process.

In a preferred embodiment, the capacitors are arranged in a field or cell array, wherein at least one vertical plug is arranged between at least two neighbouring capacitors situated at a border of the field, wherein the plugs are in contact with the first common electrode and the second common electrode. Capacitors at the boarder of the field tend to be of lower quality. These capacitors may be sacrificed in order to provide a interconnection of the first and the third conductive layer in order to form the common electrode. Thus the capacitors of higher quality in the inner area of the field may be left unchanged.

According to another preferred embodiment, a liner layer is deposited on the surface of the first dielectric layer. This liner layer protects the first dielectric layer during the removal of the sacrificial pillar. After a removal of the sacrificial pillar the liner layer is removed by a selective removal process, i.e. etching or ashing.

BRIEF DESCRIPTION OF THE DRAWINGS

Exemplary embodiments of the invention are illustrated in the drawings and explained in more detail in the following description.

In the figures:

FIG. 1a-13a partial cross sections of a semiconductor device in a side view to illustrate a first version of the invention.

FIG. 1b-13b cross sections in top view corresponding to the FIGS. 1a-13a;

FIG. 14a-14c partial cross sections of a semiconductor device formed according to a second version of the invention.

FIG. 16a-18a partial cross sections of a semiconductor device in a side view to illustrate a fourth version of the invention.

FIG. 16b-18b cross sections in top view corresponding to the FIGS. 16a-18a.

In the following drawings identical reference numerals indicate identical or similar features.

DETAILED DESCRIPTION OF THE INVENTION

Figure 1A:
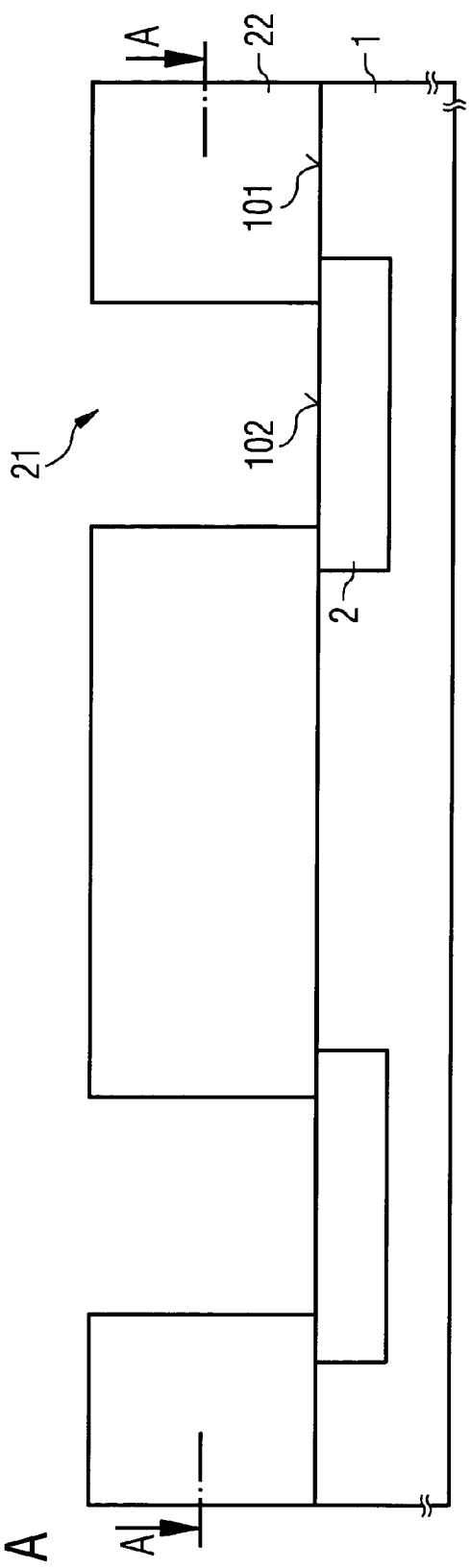
Figure 1B:
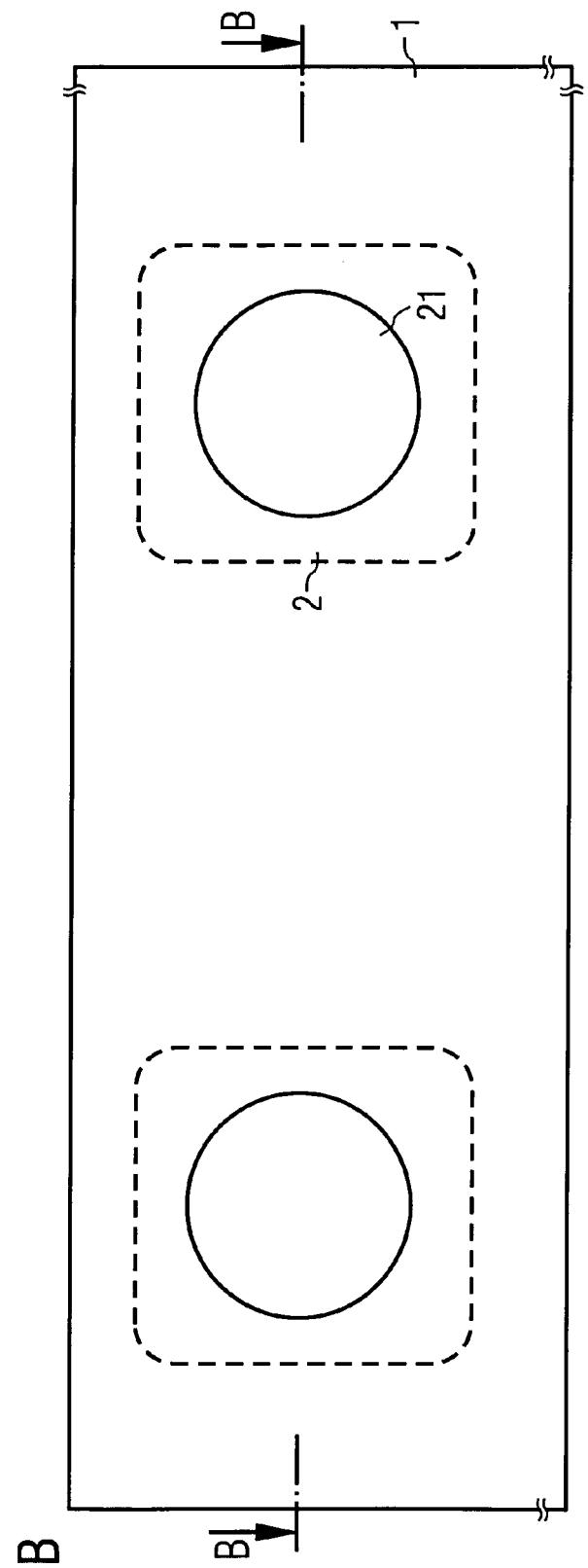

Along with FIGS. 1a-13a and 1b-13b one version of a method of forming a double sided capacitor structure will be explained in full detail. FIGS. 1a to 13a are partial cross sections in side view through a semiconductor substrate 1 and structures provided on a first surface 101 of the semiconductor substrate 1. A horizontal plane A-A in FIGS. 1a to 13a is represented by a cross section illustrated in the FIGS. 1b to 13b. The partial cross section of the FIGS. 1a to 13a lies in the plane B-B indicated in the FIGS. 1b to 13b.

All dimensions, e.g. length, width, distance etc., as illustrated in the figures do neither represent real dimensions nor their relations. In fact they may differ significantly.

In a first step of a first version of a method of manufacturing a double sided capacitor a semiconductor substrate 1 is provided comprising contact pads 2 arranged at a first surface 101 of the semiconductor substrate 1. A masking layer 22 with a thickness of 2 to 3 µm or even thicker is deposited on the first surface 101. This masking layer 22 may comprise a silicon oxide, a silicon glass, or other materials that can be deposited with a thickness of several micrometers in a short time, e.g. less than an hour, and/or at low temperatures, e.g. less than 1000° C. Thus, the thermal stress on the semiconductor substrate 1 and structures within the semiconductor substrate 1 remains low. In a subsequence step vertical openings or trenches 21 are formed above the contact pads 2 such that a surface 102 of the contact pads 2 is at that least partially exhibited. The patterning and structuring of the masking layer 22 may be achieved by conventional processing steps like lithography and subsequent etching steps. The diameter of the contact pads 2 may be smaller or larger than the diameter of the trenches 21.

Figure 2A:
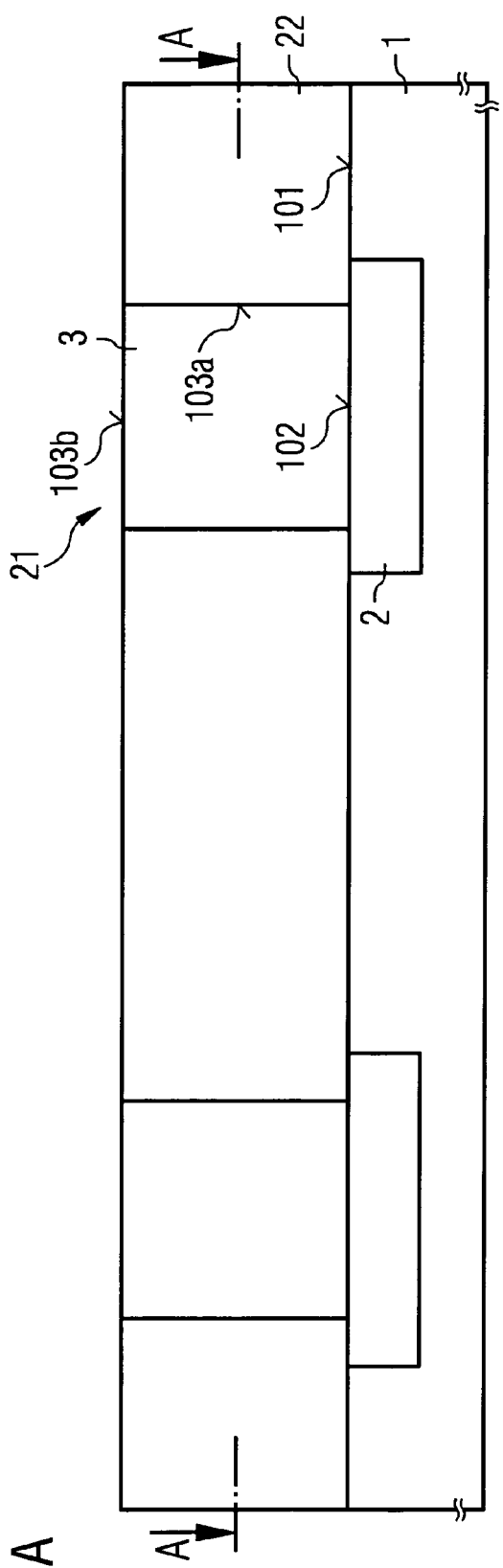
Figure 2B:
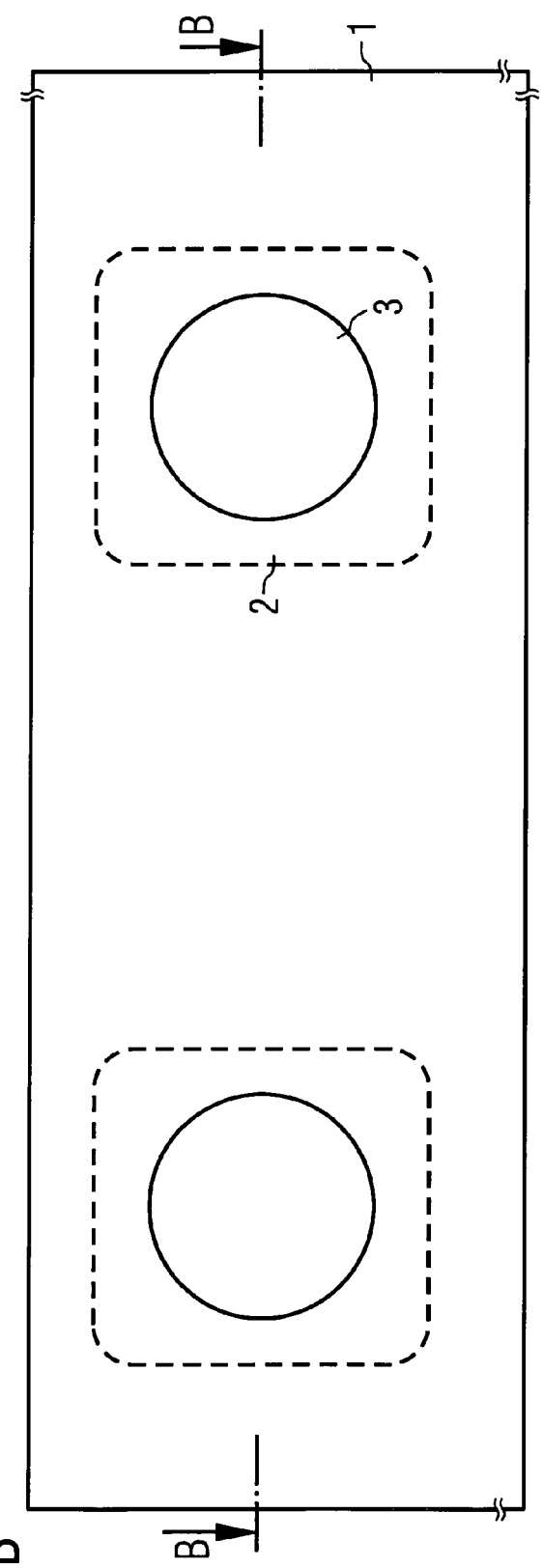

The trench 21 is filled with a sacrificial material. Thus vertical pillars 3 with walls 103a and an upper surface 103b are formed above the contact pads 2 (FIG. 2a, 2b). The sacrificial material may be a amorphous silicon or a silicon glass. Afterwards the masking layer 22 is removed, for example by a selective wet etching process (FIG. 3a, 3b).

The vertical pillars 3 may be as well formed by applying amorphous silicon with a thickness of 2 to 3 µm or more on the surface 101 of the semiconductor substrate 1 and a subsequent structuring process which may include a lithographic step.

A first dielectric layer 4 is deposited onto the pillar 3 and may be deposited as well on first the surface 101 of the semiconductor substrate 1. Thus the walls 103a of the pillar 3 are covered by the first dielectric layer 4. Additionally, said first dielectric layer 4 may cover parts of the surface 102 of the contact pads 2 not being covered by the pillar 3. Thus the contact pads 102 and the first surface 101 of the semiconductor substrate 1 are completely isolated from layers applied afterwards on top of the semiconductor substrate 1 (FIGS. 4*a*, 4*b*).

A first conductive layer 5 is deposited onto the first dielectric layer 4. Such that the first dielectric layer 4 along the walls 103*a* of the pillar is in contact with the first conductive layer 5. The height of the first conductive layer 5 may be chosen such that an upper surface 105 of the first conductive layer 5 resides in a plane on or above a plane defined by the upper surface 103*b* of the pillar 3. However, advantageously, the upper surface 105 of the first conductive layer 5 is below the upper surface 103*b* of the pillars 3. A non-conductive layer 6 is applied onto the upper surface 105 of the first conductive layer 5 wherein an upper surface 106 of the non-conductive layer is in the plane defined by the first surface 103*b* of the pillar 3 (FIGS. 5*a*, 5*b*).

Figure 6A:
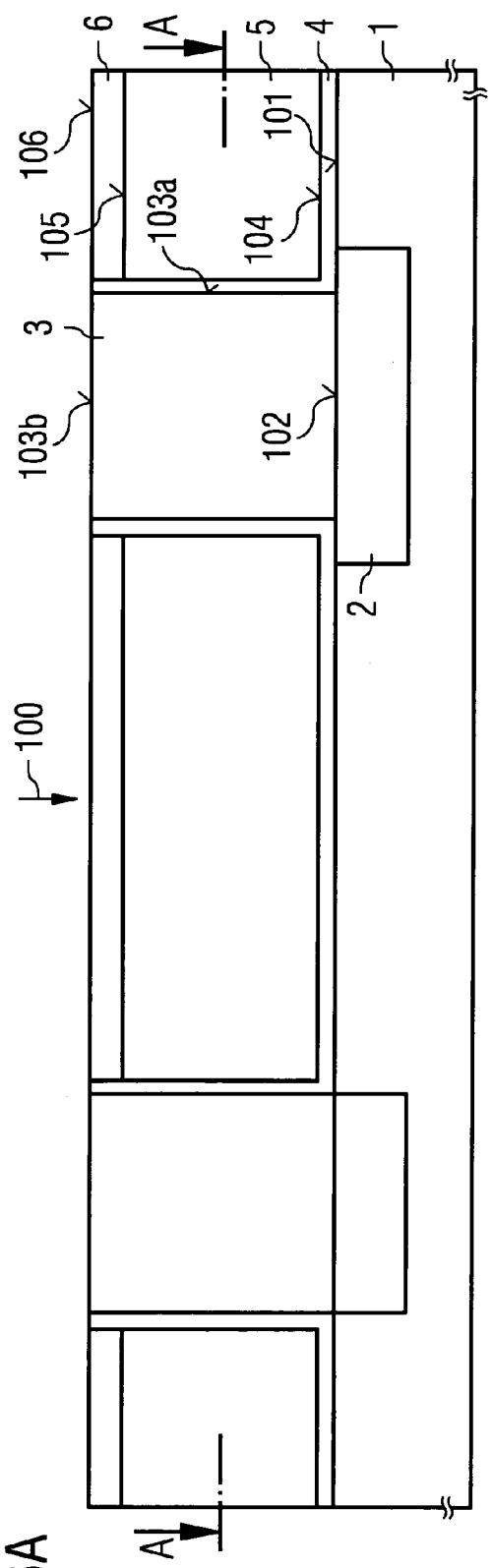
Figure 6B:
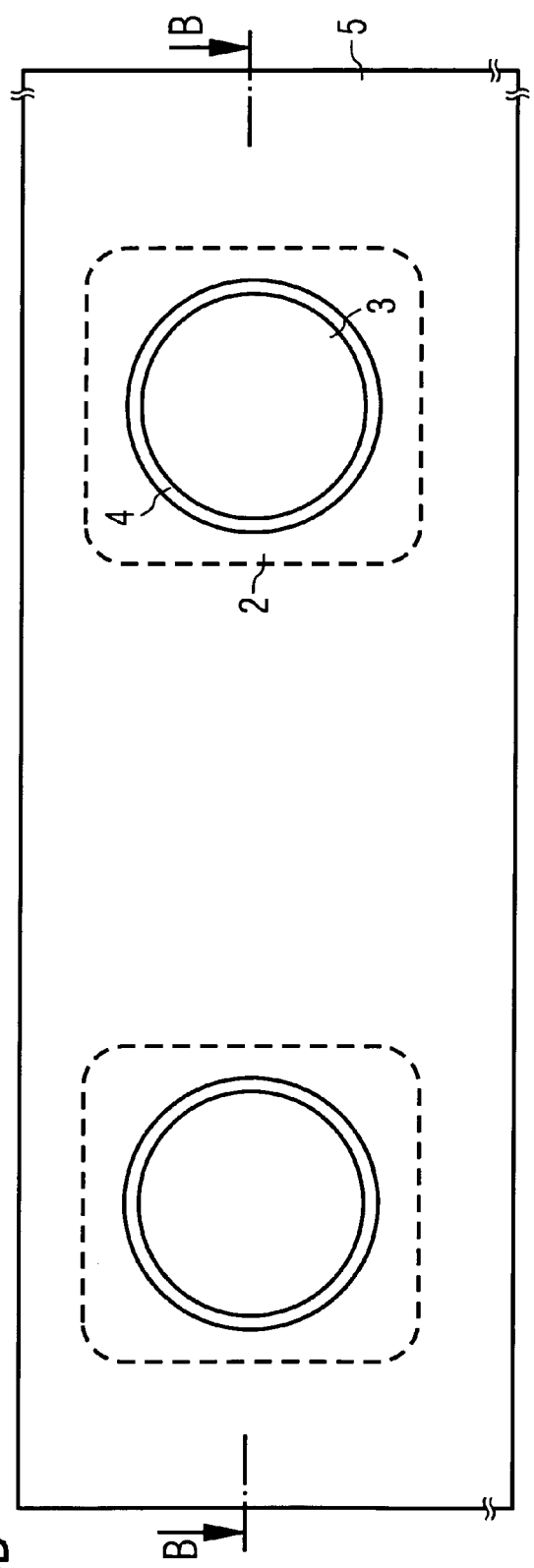

By a polishing process the first dielectric layer 4 is removed from an upper surface 103*b* of the pillar 3 (FIGS. 6*a*, 6*b*). This polishing step may as well remove excess portions of the first conductive layer 5 and the non-conductive layer 6 above the pillar 3.

By a selective etch process substantially only the pillar 3 is removed from the pad contacts 2. The non-conductive layer 6 and the first dielectric layer 4 are not etched by this process. Thus trenches 7 are formed at places occupied before by the pillars 3. The trench 7 is provided with vertical walls 103*a* covered by the first dielectric material 4. Further, the trench extends to the contact pad 2 such that the contact pad 2 is at least partially exhibited (FIGS. 7*a*, 7*b*).

A second conductive layer 8 is deposited into the trench 7. The vertical walls 103*a* of the trench 7 and the contact pad 2 are covered by the second conductive layer 8. Thus a cup shaped second conductive layer 8 comprising a vertical part 108*a* and a horizontal part 108*b* is formed in the trench 7 (FIGS. 8*a*, 8*b*).

Figure 10A:
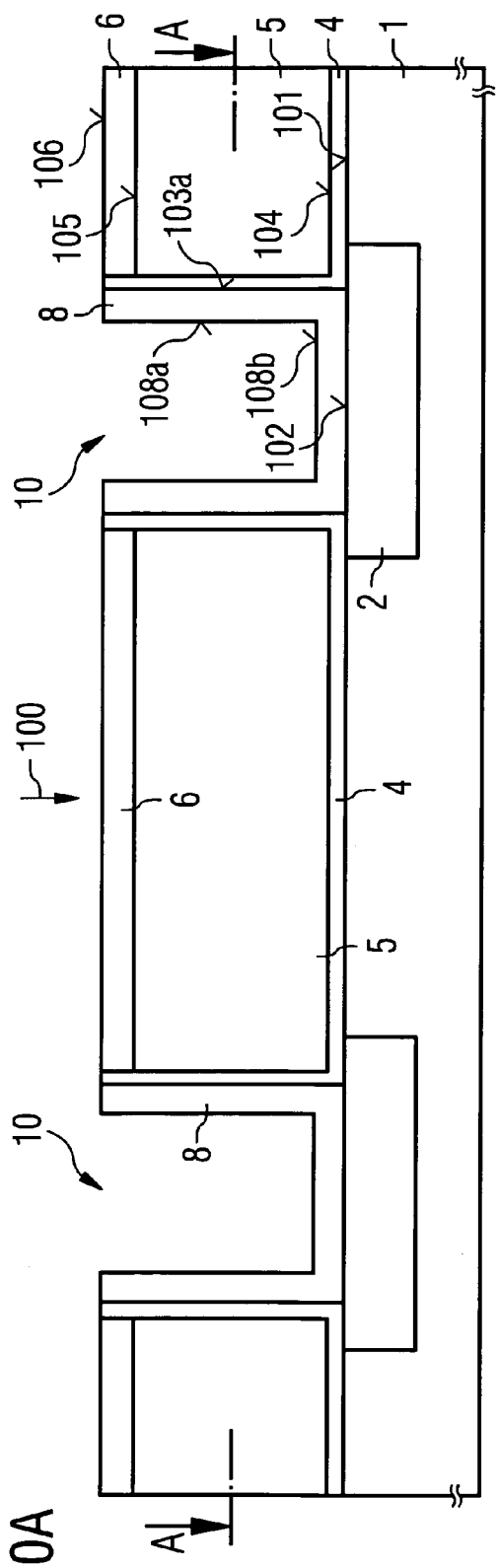
Figure 10B:
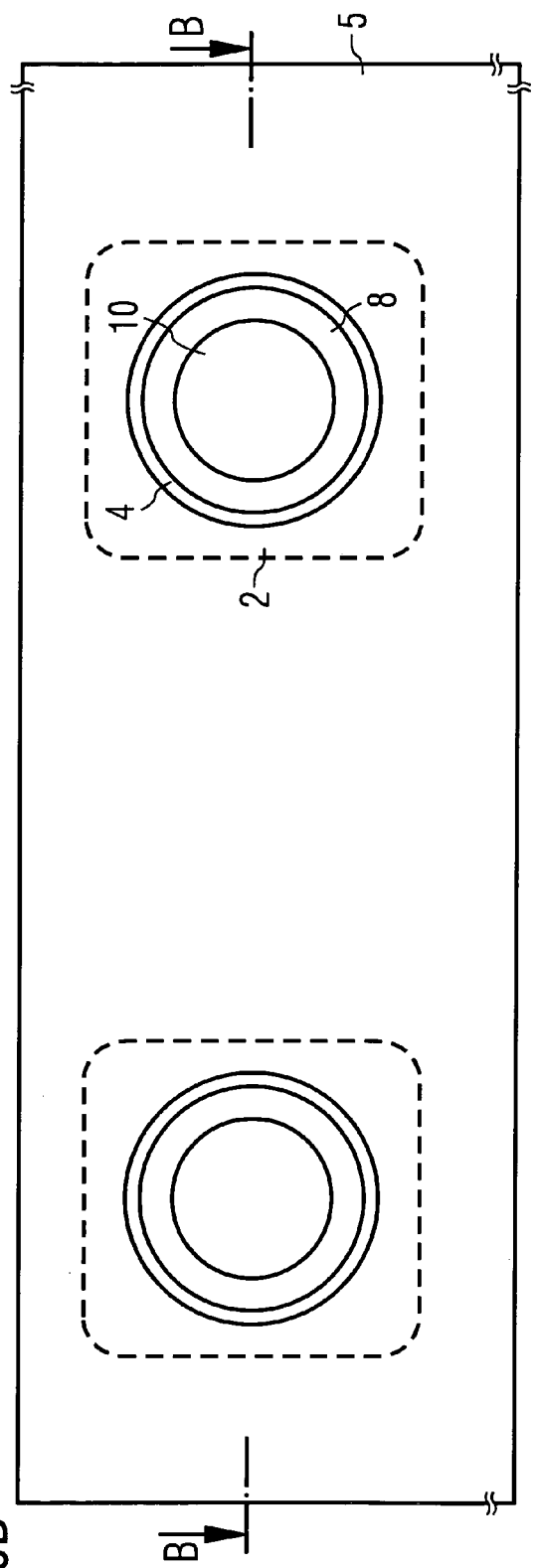

A remaining inner space 10 of the trench 7 is filled with a sacrificial plug 9 (FIGS. 9*a*, 9*b*). Then an excess portion of the second conductive layer 8 deposited onto the second conductive layer 6 is removed by a polishing process. The polishing process is maintained until an excess portion of the second conductive layer 8, i.e. parts of the second conductive layer 6 deposited above the non-conductive layer 5, is removed from the non-conductive layer 6. Afterwards the sacrificial plugs 9 are removed which protected the cup shaped second conductive layer 8 in the trench 7 against chemicals of the polishing process (FIGS. 10*a*, 10*b*). The sacrificial plugs 9 provided additional mechanical stability to the second conductive layer and other structures during the polishing process.

Figure 11A:
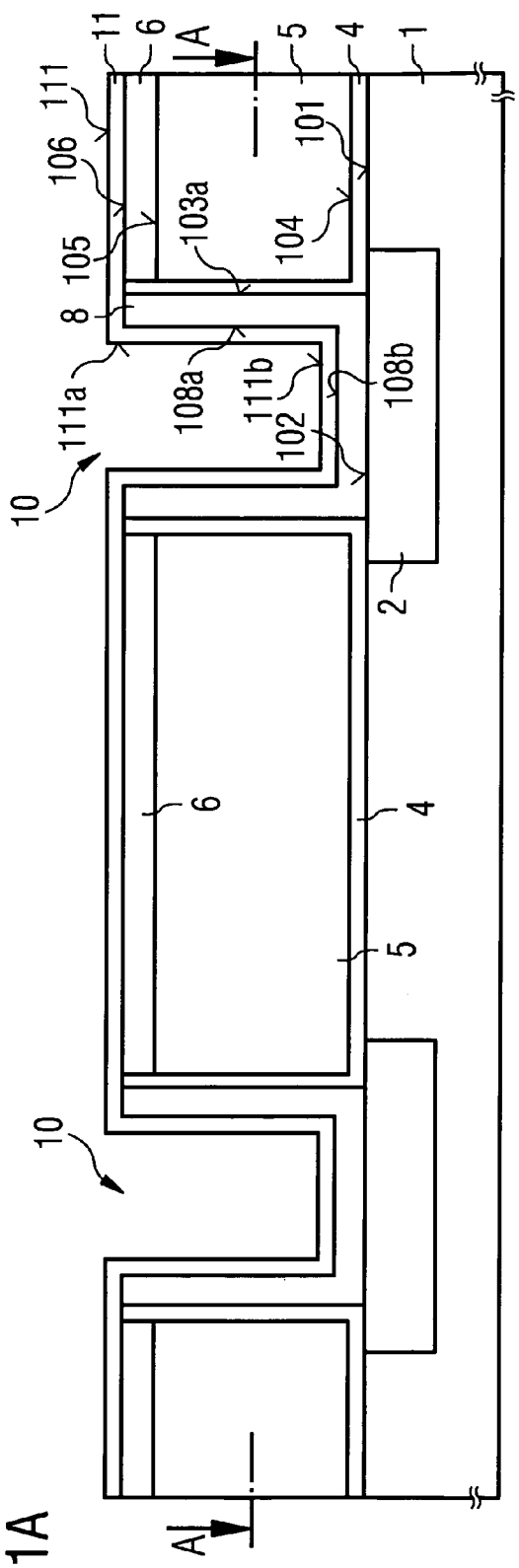
Figure 11B:
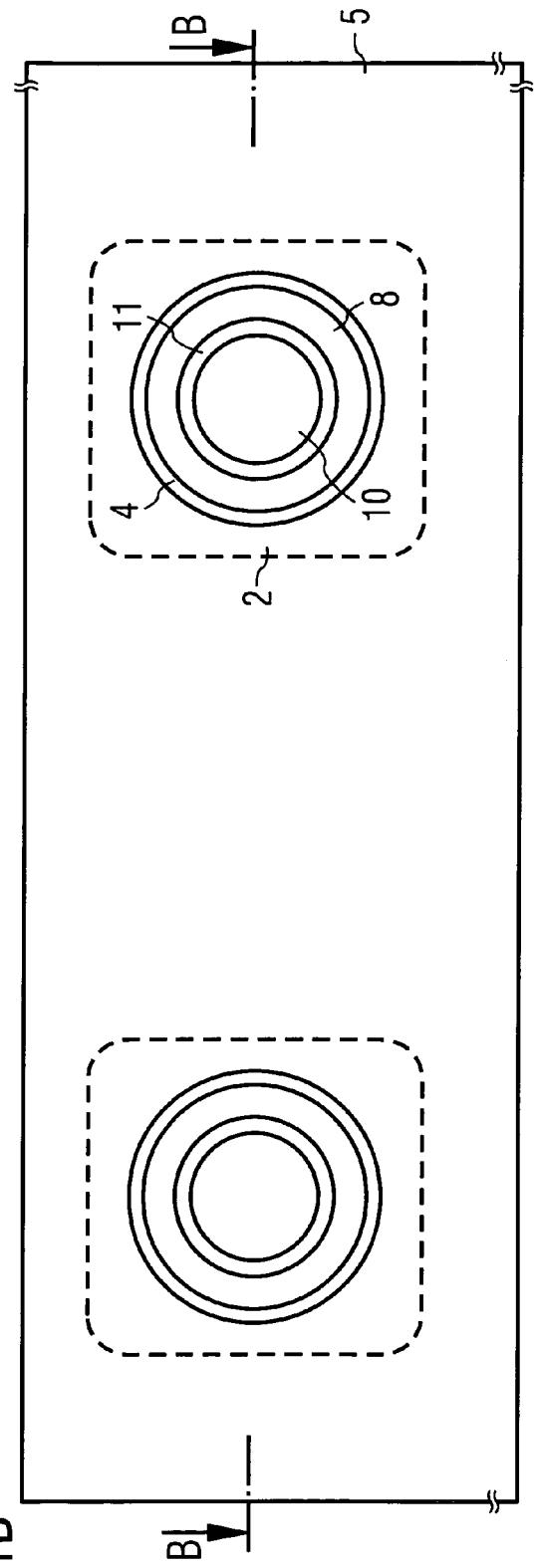

A second dielectric layer 11 is deposited onto the cup shaped second conductive layer 8. In the inner part 10 of the cup shaped second conductive layer 8 the vertical part 108*a* and the bottom part 108*b* are covered by the second dielectric layer 11. It is reminded that the outer surface along the wall 103*a* is covered by the first dielectric layer 4. The bottom part 108*b* of the cup shaped second conducive layer 8 is in electrical contact with the contact pad 2. By the deposition process of the second dielectric layer 11, said second dielectric layer 11 may be as well deposited onto the non-conductive layer 6 (FIGS. 11*a*, 11*b*).

Figure 12A:
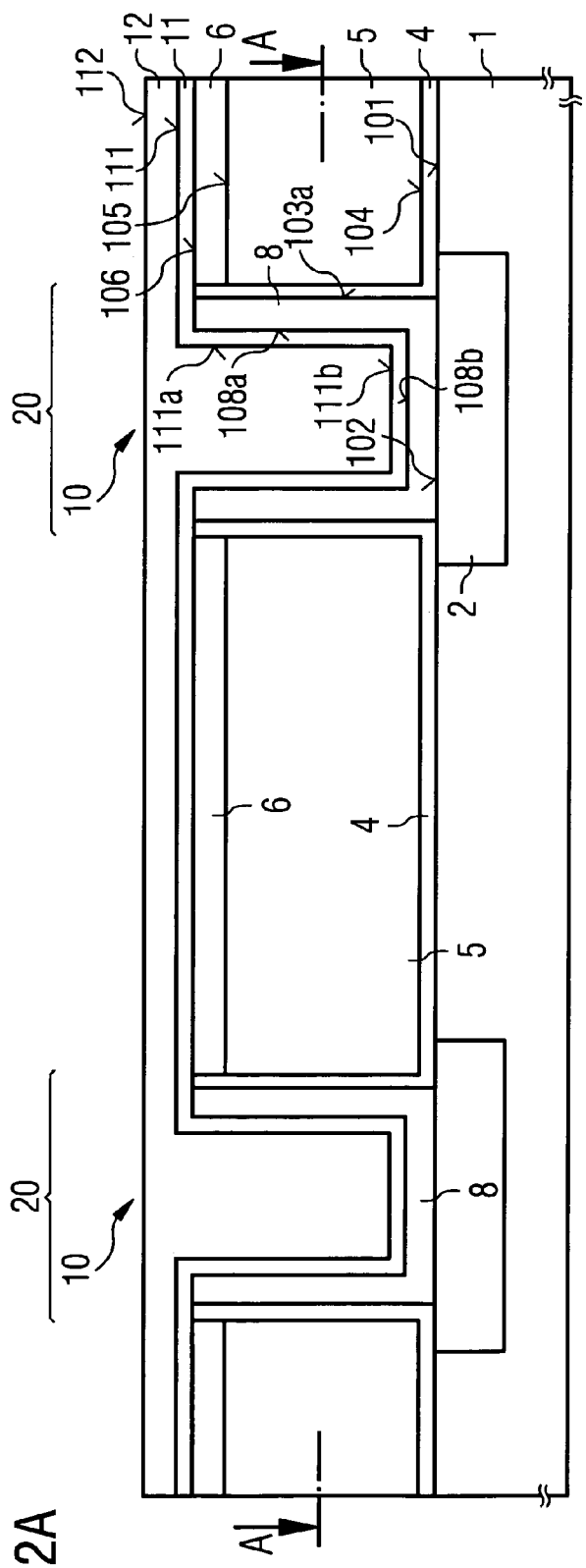
Figure 12B:
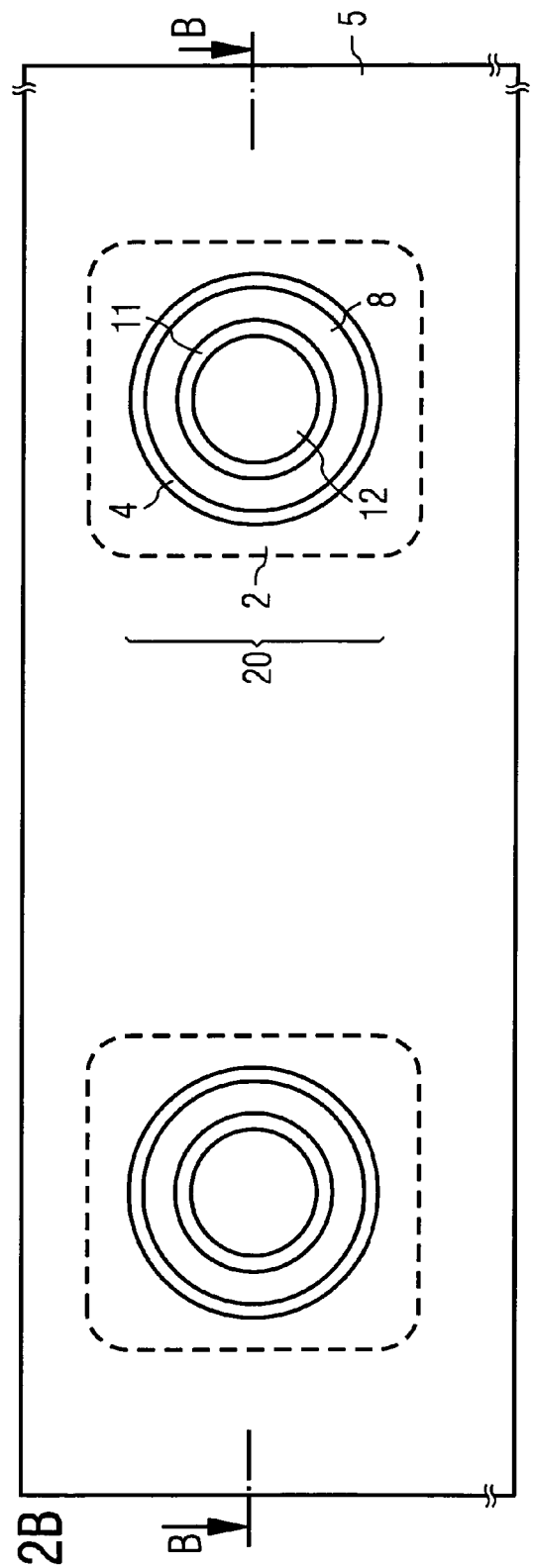

In a next step, a third conductive layer 12 is deposited onto the second dielectric layer 11. In one version a thickness of the third conductive layer 12 may be chosen such that an inner space 10 of the cup shaped second conductive layer 8 is filled. In a second version the thickness of the third conductive layer 12 may be chosen thinner than half the diameter of the inner space 10 such that the second dielectric layer 11 is covered but the inner space 10 is not completely filled. The third conductive layer 12 is as well applied on top of the first conductive layer 5 and the non-conductive layer 6. Thus the third conductive layer 12 provided into the individual trenches 7 is interconnected (FIGS. 12*a*, 12*b*).

Figure 13A:
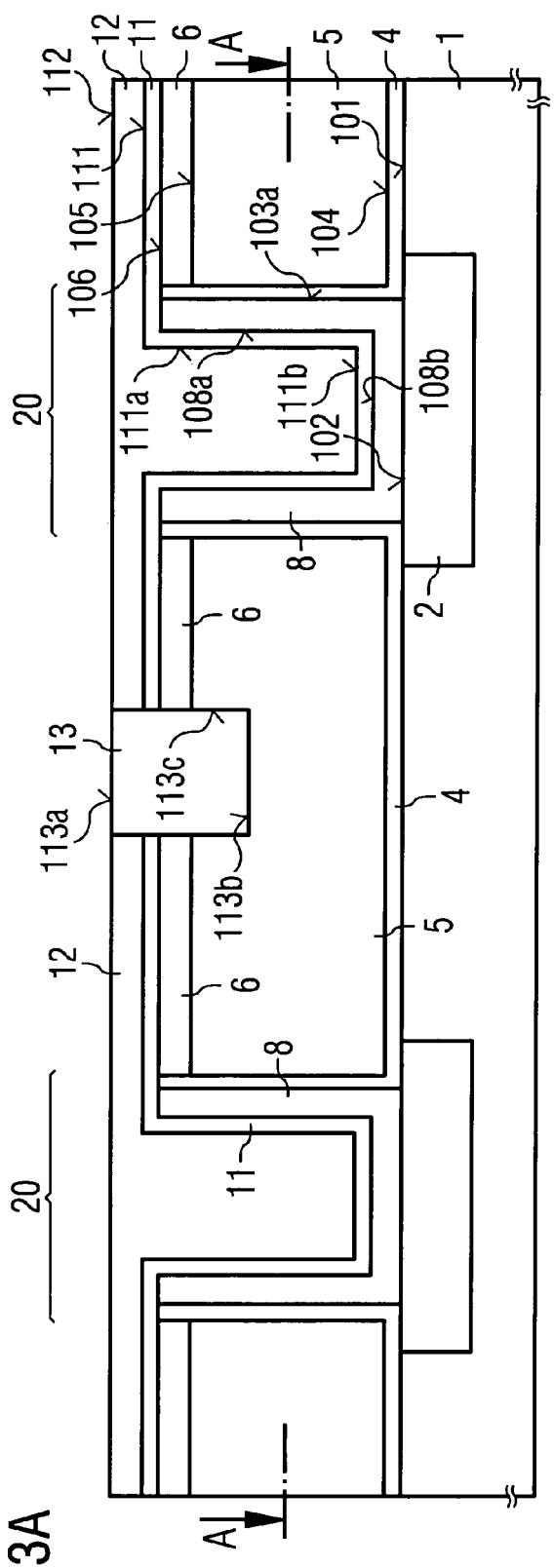
Figure 13B:
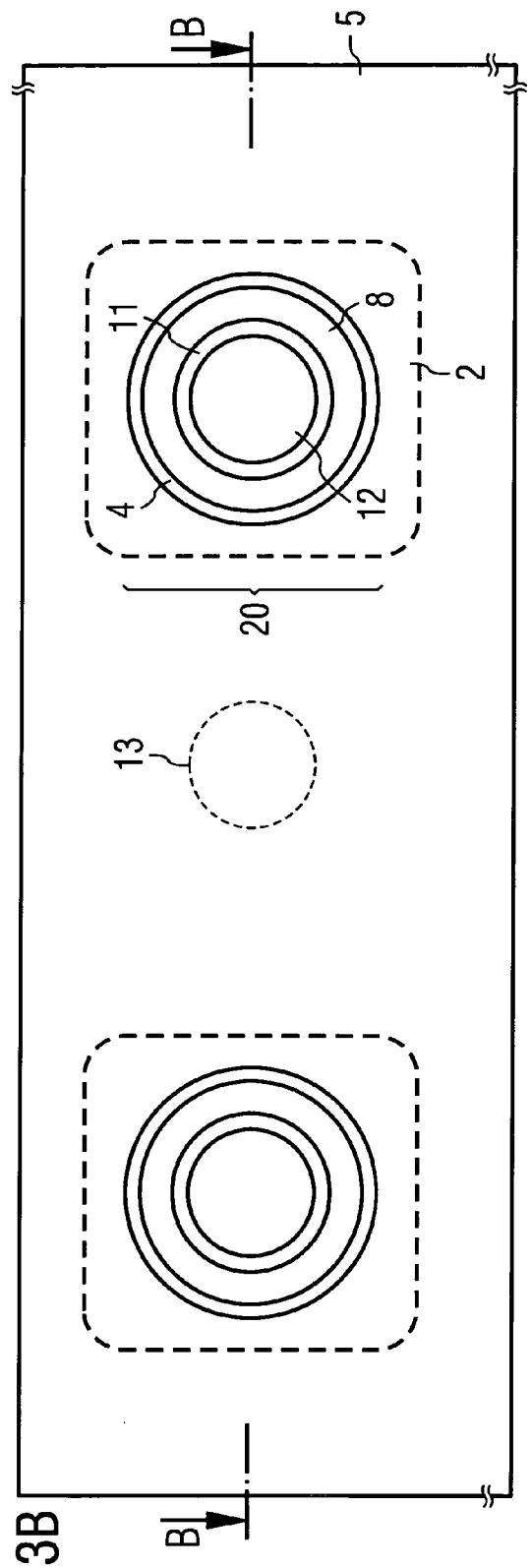

In one final step a vertical conductive plug 13 is formed through the second dielectric layer 11 in an area between two cup shaped second conductive layers 8 (FIGS. 13*a*, 13*b*). An upper surface 113*a* of the vertical plug resides in the third conductive layer 12 and a lower surface 113*b* of the plug 13 resides in the first conductive layer 5. Thus, the first conductive layer 5 and the third conductive layer 12 are electrically connected.

FIGS. 13*a* and 13*b* illustrate a double sided capacitor structure 20. This capacitor structure comprises an addressable electrode 8 having a cup shaped form. The cup shaped electrode 8 is provided with an inner surface comprising a vertical part 108*a* and a horizontal part 108*b* and the outer surface comprises substantially a vertical part 103*a*. The inner and outer surfaces are both covered by dielectric layers 4, 11. A first part of a common electrode 5 (first common electrode) is arranged such that said first common electrode 5 is in contact with the dielectric 4 covering the outer surface 103*a* of the addressable electrode 8. A second common electrode 12 extends into the cup shaped addressable electrode 8 which is isolated from the second common electrode 12 by the second dielectric layer 11 applied on the inner surface 108*a*, 108*b* of the addressable electrode 8. The first common electrode 5 and the second common electrode 12 are connected by a vertical plug 13 arranged horizontally displaced from the capacitor structure 20. Thus the first common electrode 5 and the second common electrode 12 form a continuous common electrode as it becomes evident by the cross section in top view illustrated in FIG. 13*b*. In principle a single vertical conductive plug 13 would be sufficient for a plurality of capacitor structures 20 in order to interconnect the first and second common electrode 8, 12. In FIG. 13*b* the plug 13 is arranged in the middle of two neighbouring capacitors 20. This is only one of a plurality of arrangements. The plug 13 may be as well displaced to the middle, or be arranged in the middle of two diagonally neighbouring capacitors 20 of a field of capacitors 20.

Figure 14A:
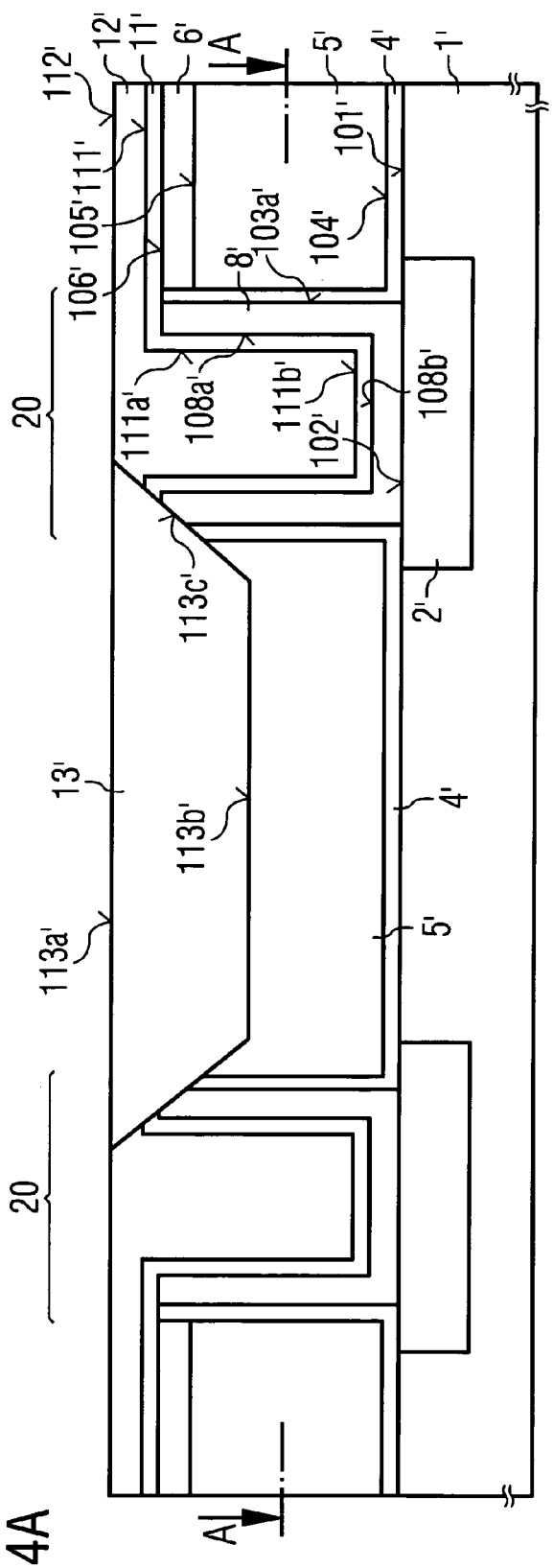
Figure 14B:
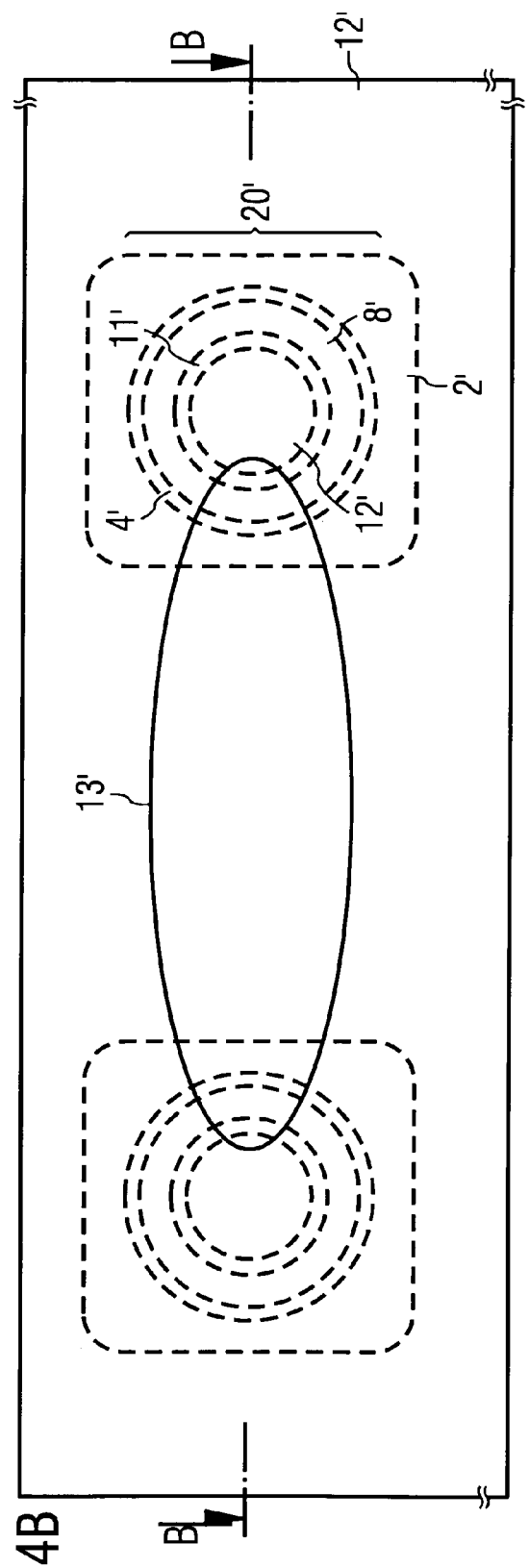

In order to achieve a maximum lateral density of capacitor structures a distance between neighbouring capacitor structures may be reduced to a minimal achievable structure size. Therefore, a plug 13', as illustrated in FIGS. 14*a*, 14*b*, 14*c*, has a lateral dimension which is in the range of the distance between the neighbouring capacitors 20'. Therefore, a plug 13', as illustrated in FIGS. 14*a*, 14*b*, 14*c*, having at least the lateral size equal to the minimal achievable structure size, extends from one capacitor structure 20' to a second capacitor structure 20'. Thus, it can not be avoided that the vertical plug 13' contacts the cup shaped addressable electrode 8'. Therefore the vertical plug 13' as well contacts the first and second part of the common electrode 5', 12' the capacitor structures 20' having an addressable electrode 8 in contact with the vertical plug 13 are short circuits the common electrode 5', 12' and the addressable electrode 8'.

FIG. 14*c* illustrates a further embodiment of the present invention with a plurality of capacitor structures 20', 20". In a first area, preferably at the border X, Y of an array or field of capacitor structures 20', 20" vertical plugs 13' are provided between the capacitor structures 20' in order to contact the first common electrode 5' with the second common electrode 12'. As already pointed out herein before a single vertical plug 13' is sufficient to interconnect the first common electrode 5' and the second common electrode 12' for a whole array of capacitor structures 20', 20". Therefore, only the outer capacitor structures 20' are sacrificed, i.e. short circuited, and the inner capacitor structures 20" are provided with a common electrode. The outer capacitor structures 20' may be placed upon dummy contacts pads 2' which are not contacted with any further structures or directly onto the semiconductor substrate 1'.

Figure 15A:
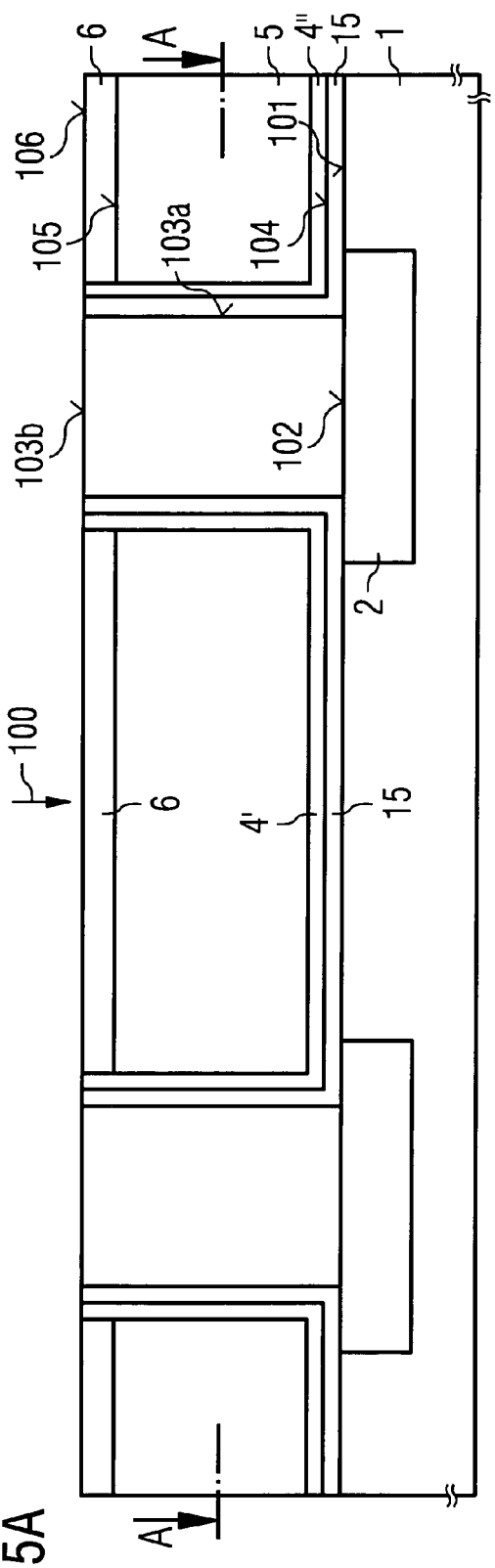
FIG. 15a, 15b partial cross section and top view of a semiconductor device illustration a third version of the invention.
Figure 15B:
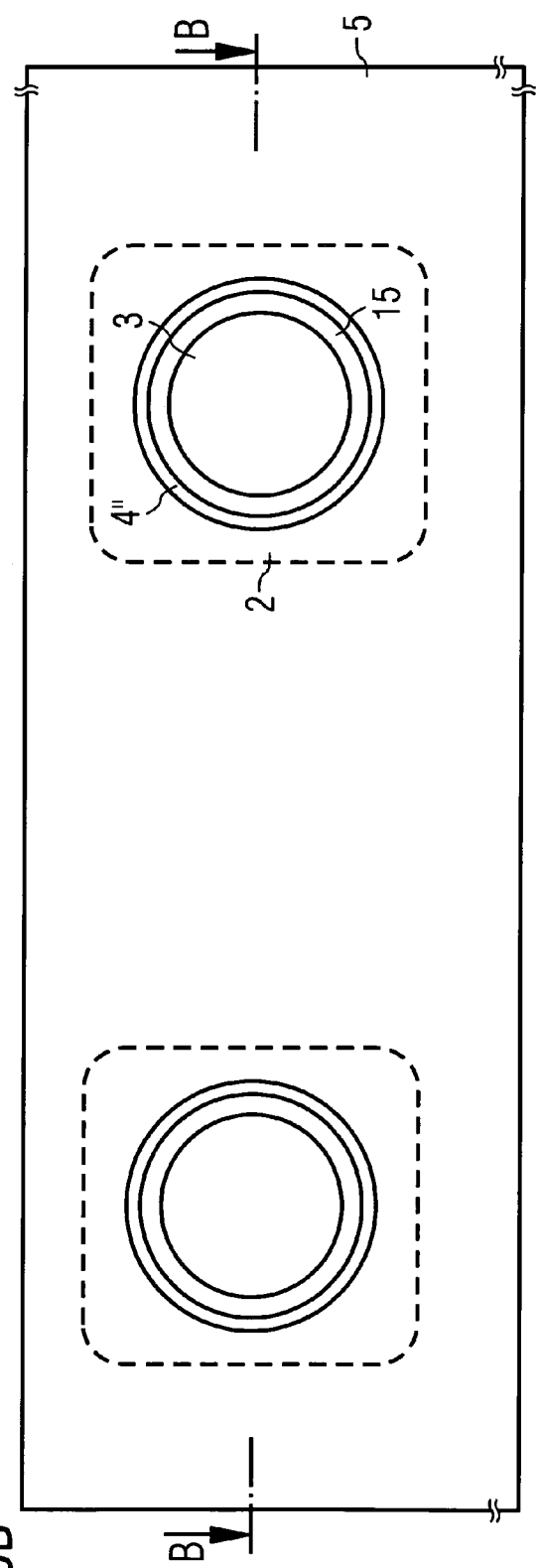

FIGS. 15a and 15b illustrate a refinement of the above described manufacturing method. A liner layer 15 is deposited on the semiconductor substrate 1 and the pillars 3 before a first dielectric layer 4" is deposited. Thus when the pillar 3 is removed the wall is formed by the liner layer 15 protecting the underlying first dielectric layer 4" during an etching process for removing the pillar 3. The liner layer 15 is removed by a selective etch process such that the first dielectric layer is not substantially (completely) removed. The advantage resides in the fact that an etch process with a extremely high selectivity would be required for removing the massive sacrificial pillar 3 without damaging the very thin first dielectric layer 4" (several nanometers thick). A removal of a non-massive liner layer 15 may be achieved with a less selective etch process.

Along with FIGS. 16a-18a and 16b-18b a fourth version of a method of forming a double sided capacitor structure will be explained. Only differences of this second version to the first version will be explained in full detail. Other manufacturing steps may be executed as described along with the first version if not explicitly pointed out otherwise.

A first difference of the second version may reside in the fact that the first dielectric layer 4 is not necessarily deposited onto the sacrificial pillars 3. When the sacrificial pillar 3 is removed for forming the trenches 7 the first conductive material 5 becomes exposed. In other words the first conductive material 5 forms at least partially the sidewalls of the trench 7.

Figure 16A:
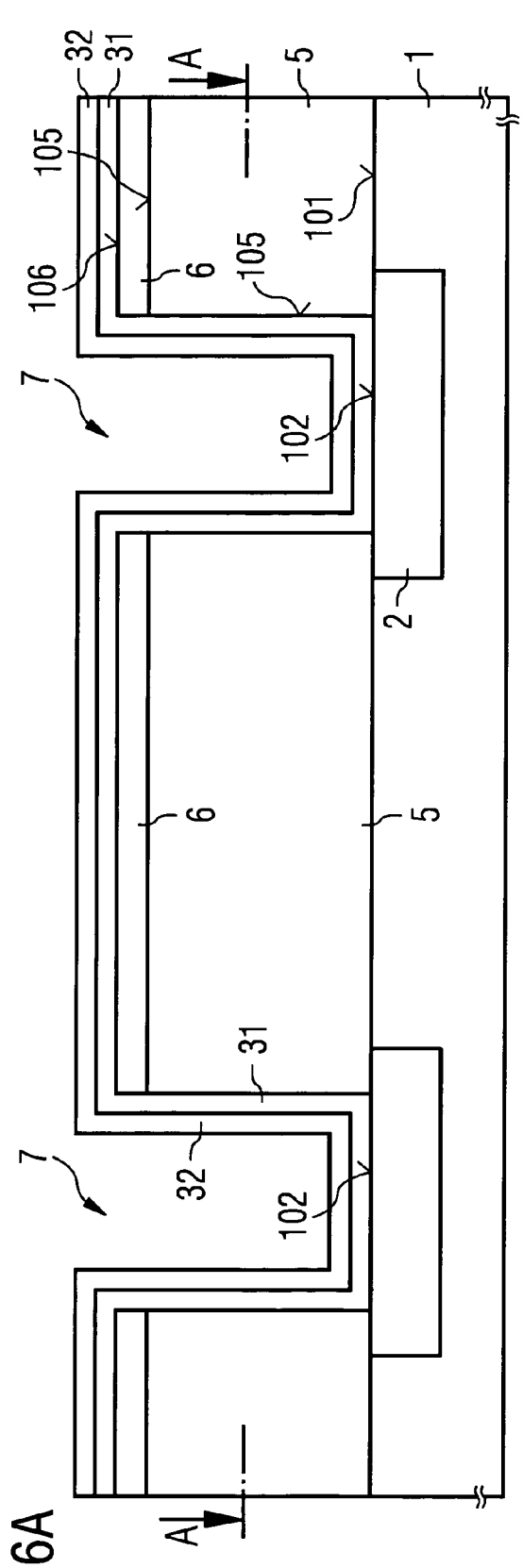
Figure 16B:
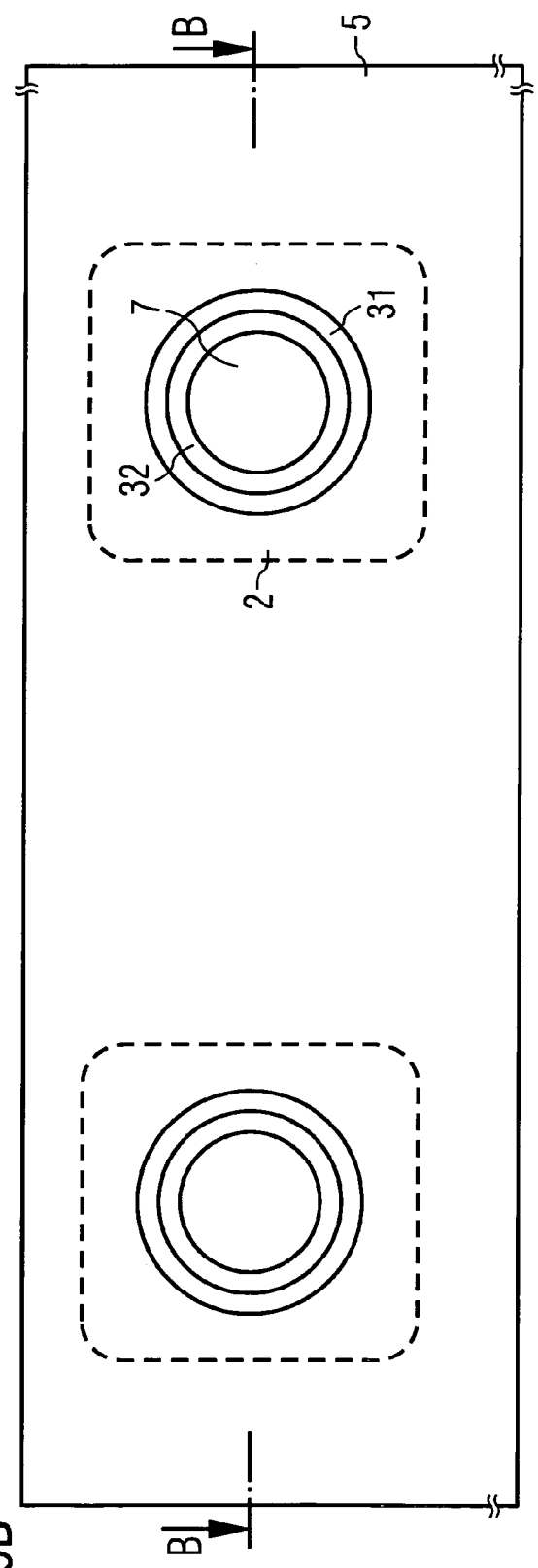
Figure 18A:
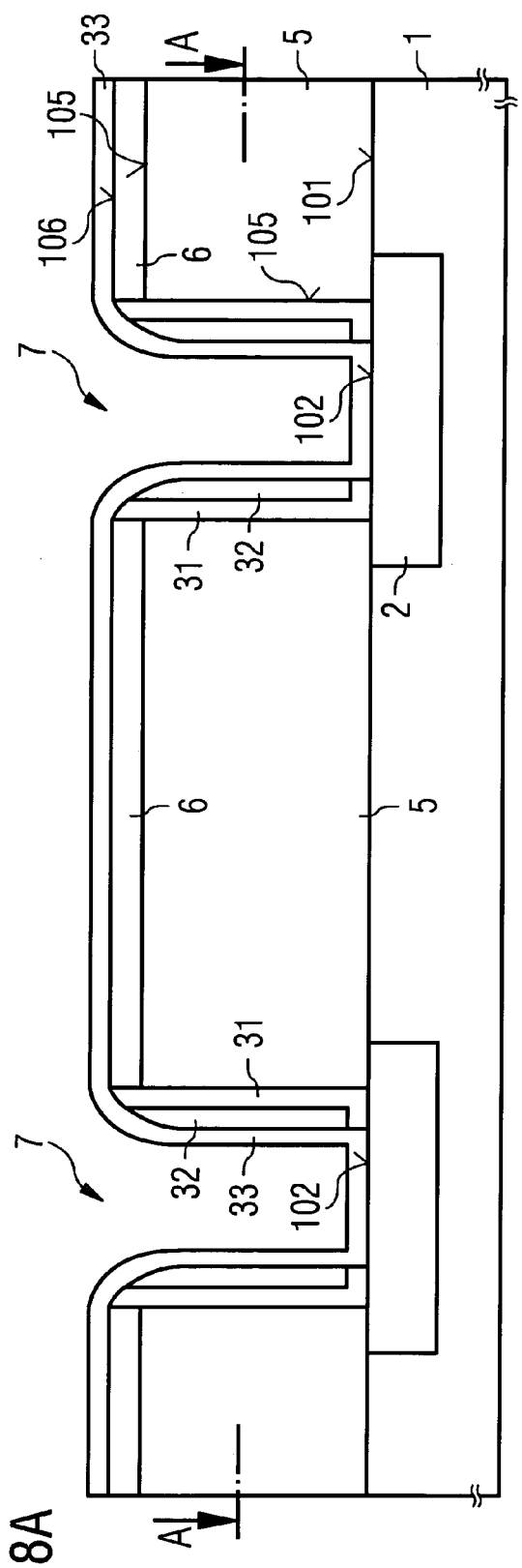
Figure 18B:
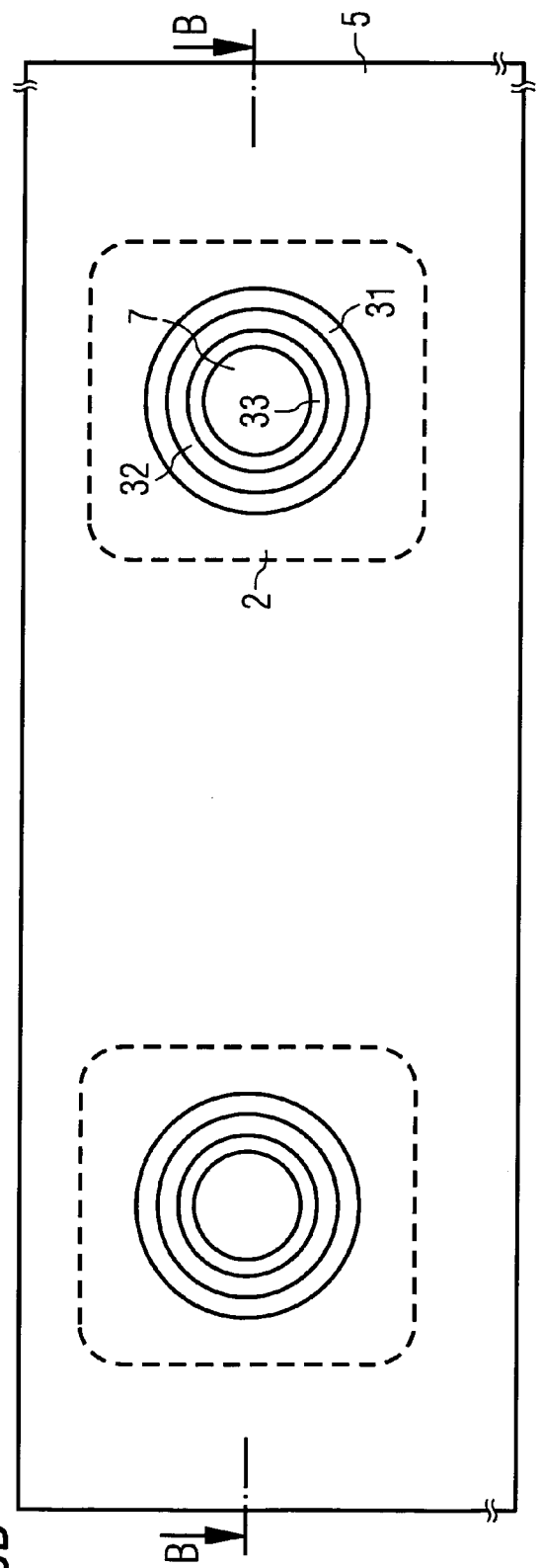

After the formation of the trenches 7 (see FIG. 7a) a first dielectric layer 31 is deposited on the side of the first surface 101. Subsequently, a protective conductive layer 32 is deposited (FIG. 16a). The purpose of this protective conductive layer 32 is to fully cover the first dielectric layer 31 at least along the sidewalls in the trench 7.

A vertical etch process or so-called spacer etch process is applied to the protective conductive layer 32 and the dielectric layer 31. The properties of the vertical etch process are chosen such that both layers 31, 32 substantially remain at the vertical sidewalls 105 and parts of said both layers deposited on horizontal surfaces, i.e. the bottom of the trench 7 and on top of the non-conductive layer 6, are completely removed (FIG. 17a). Thus the contact pad 2 becomes exposed.

At the sidewall 105, the protective conductive layer 32 might be partially etched or thinned but exhibits no openings such that it can be ensured that the very thin (of several nanometers) first dielectric layer 31 remains intact.

A second conductive layer 33 is deposited from a side of the first surface 101 on the semiconductor substrate 1 (FIG. 18a) similar to the step described along with FIG. 8a. The first dielectric layer 31 is an isolating barrier between the first conductive layer 5 and the second conductive layer 33.

The following processing steps may be executed as described along with the figures of the first processing version starting with FIG. 9a.

The first, second and third conductive layer may comprise doped polysilicon. The vertical plug may comprise doped polysilicon or a metal, for example tungsten. The dielectric layers may comprise silicon oxide, silicon nitride or high-k dielectrics. Further, the dielectric layers 4, 11, 4', 11' may comprise more than one layer in order to provide barrier layers against a diffusion of materials into the dielectric layer during high temperature or an annealing step. The non-conductive layer 6, 6' may comprise silicon oxide. The sacrificial plug 9 may comprise a resist and the sacrificial material silicon oxide. The thickness of the non-conductive layer 6 is chosen such that the first conductive layer 5 remains covered by the non-conductive layer 6 even after the polishing step describe along with FIGS. 6a, 6b. The advantage of this non-conductive layer 6 resides in the fact that the non-conductive layer 6 prevents short circuits of the cup-shaped first conductive layer 5 with tips of the cup-shaped second conductive layer 8 in the area of the surface 105.

In the figures the horizontal cross section of the capacitor structures is basically circular, but this is only one of a plurality of possible cross sections, the cross section may be elliptical or elongated. The vertical cross sections of the cup shaped electrode illustrate orthogonal walls. But these electrodes may as well be provided with a larger diameter close to the first surface. The pillars have to be formed accordingly in vee-shaped trenches.

Although the present invention has been described hereinabove along with preferred embodiments, the present invention is not limited by these embodiments, but only by the scope of the present invention. Someone skilled in the art would appreciate that various modifications, additions and substitutions are possible without leaving the scope of the present invention.

What is claimed is:

1. A method of manufacturing an integrated circuit comprising a semiconductor device having a plurality of capacitors, comprising:
   (a) providing a semiconductor body having a plurality of contact pads arranged on a first surface of the semiconductor body;
   (b) forming pillars of a first sacrificial material at least on the contact pads vertically protruding from the surface;
   (c) depositing a first dielectric layer to cover at least the pillars;
   (d) depositing a first conductive layer, at least partially, filling an area between the pillars covered by the first dielectric layer;
   (e) depositing a non-conductive layer on a horizontal surface of the first conductive layer;
   (f) removing the pillars to provide trenches arranged in the first conductive layer having walls provided by the dielectric layer;
   (g) depositing a second conductive layer on the first dielectric layer at least in the trenches;
   (h) depositing a second dielectric layer such that at least the second conductive layer in trenches is covered by the second dielectric layer;
   (i) depositing a third conductive layer at least on the second dielectric layer; and
   (j) forming at least one conductive plug through at least the second dielectric layer vertically, thereby electrically connecting the first conductive layer and the third conductive layer.

2. The method according to claim 1, wherein removing the pillars is executed by an etch process.

3. The method according to claim 1, wherein the sacrificial material comprises amorphous silicon.

4. The method according to claim 1, further comprising performing a chemical mechanical polishing after depositing the second conductive layer to remove the second conductive layer arranged above the first conductive material.

5. The method according to claim 1, wherein the conductive plug is formed at least partially above an area between two exterior contact pads of the plurality of contact pads.

6. The method according to claim 1, wherein the conductive plug is formed by an elliptical horizontal cross section and a trapezoid vertical cross section.

7. The method according to claim 1, wherein the conductive plug connects the first conductive layer, the second conductive layer and the third conductive layer.

8. The method according to claim 1, wherein the pillars are formed by the following:
   (b1) forming an oxide on the first surface of the semiconductor body;
   (b2) forming trenches into the oxide such that the contact pads are at least partially exhibited;
   (b3) filling the trenches with said material; and
   (b4) removing the oxide.

9. The method according to claim 1, wherein the pillars are formed by the:
   (b1) applying the sacrificial material on the first surface of said semiconductor body; and
   (b2) patterning the sacrificial material by a lithographic process and followed by an etch process.

10. The method according to claim 1, wherein a liner layer is deposited on the surface of the first dielectric layer.

11. A method of manufacturing an integrated circuit comprising a semiconductor device having a plurality of capacitors, comprising:
    (a) providing a semiconductor body having a plurality of contact pads arranged on a first surface of the semiconductor body;
    (b) forming pillars of a first sacrificial material at least on the contact pads vertically protruding from the first surface;
    (c) depositing a first conductive layer, at least partially, filling an area between the pillars covered by a first dielectric layer,
    (d) depositing a non-conductive layer on a horizontal surface of the first conductive layer;
    (e) removing the pillars to provide trenches arranged in the first conductive layer having walls provided by the dielectric layer;
    (f) depositing a first dielectric layer and a protective conductive layer from a side of the first surface;
    (g) etching horizontal parts of the first dielectric layer and the protective conductive layer by a spacer etch process;
    (h) depositing a second conductive layer on the protective conductive layer at least in the trenches;
    (i) depositing a second dielectric layer such that at least the second conductive layer in trenches is covered by the second dielectric layer; and
    (j) depositing a third conductive layer at least on the second dielectric layer; and
    (k) forming at least one conductive plug through at least the second dielectric layer vertically, thereby electrically connecting the first conductive layer and the third conductive layer.

12. The method according to claim 11, wherein removing the pillars is executed by an etch process.

13. The method according to claim 11, wherein the sacrificial material comprises amorphous silicon.

14. The method according to claim 11, wherein applying a chemical mechanical polishing after depositing the second conductive layer to remove the second conductive layer arranged above the first conductive material.

15. The method according to claim 11, wherein the conductive plug is formed at least partially above an area between two exterior contact pads of the plurality of contact pads.

16. The method according to claim 11, wherein the conductive plug is formed by an elliptical horizontal cross section and a trapezoid vertical cross section.

17. The method according to claim 11, wherein the conductive plug connects the first conductive layer, the second conductive layer and the third conductive layer.

18. The method according to claim 11, wherein the pillars are formed by the following:
    (b1) forming an oxide on the first surface of the semiconductor body;
    (b2) forming trenches into the oxide such that the contact pads are at least partially exhibited:
    (b3) filling the trenches with said sacrificial material; and
    (b4) removing the oxide.

19. The method according to claim 11, wherein the pillars are formed by the:
    (b1) applying the sacrificial material on the first surface of the semiconductor body; and
    (b2) patterning the sacrificial material by a lithographic process and followed by an etch process.

20. A method of forming an integrated circuit comprising a semiconductor device having a capacitor structure, comprising;
    providing a semiconductor body;
    forming a sacrificial pillar structure on the semiconductor body;
    forming a first dielectric layer on a sidewall of the sacrificial pillar, wherein forming the first dielectric on the sidewall of the sacrificial pillar comprises forming the first dielectric around an entire perimeter of the sacrificial pillar, thereby surrounding the sacrificial pillar;
    forming a first conductive layer around at least a portion of the sacrificial pillar, thereby covering the first dielectric layer on the sidewall thereof, wherein forming the first conductive layer around at least a portion of the sacrificial pillar comprises forming the first conductive layer around the entire perimeter of the pillar, thereby covering and surrounding the first dielectric layer on the sidewall of the pillar;
    removing the sacrificial pillar, thereby defining a trench having the first dielectric layer on a sidewall thereof;
    forming a second conductive layer on the trench sidewall, thereby sandwiching the first dielectric layer between the first and second conductive layers;
    forming a second dielectric layer in the trench covering the second conductive layer, and overlying a horizontal surface of the conductive layer; and
    forming a third conductive layer covering the second dielectric layer in the trench, wherein the first and third conductive layers are electrically coupled together and form a first capacitor electrode, and the second conductive layer forms a second capacitor electrode.

21. The method of claim 20, further comprising forming a second conductive layer on the trench sidewall comprises forming the second conductive layer around an entire inner perimeter of the first dielectric layer, thereby sandwiching the first dielectric layer between the first and second conductive layers.

22. The method in claim 21, further comprising:
    forming a second dielectric layer in the trench covering the second conductive layer, and overlying the first conductive layer; and
    forming a third conductive layer covering the second dielectric layer in the trench, wherein the first and third conductive layers are electrically coupled together and form a first capacitor electrode, and the second conductive layer forms a second capacitor electrode.

* * * * *

UNITED STATES PATENT AND TRADEMARK OFFICE
CERTIFICATE OF CORRECTION

PATENT NO. : 7,468,306 B2 Page 1 of 1
APPLICATION NO. : 11/139975
DATED : December 23, 2008
INVENTOR(S) : Andreas Thies et al.

It is certified that error appears in the above-identified patent and that said Letters Patent is hereby corrected as shown below:

On the Title Page, Item (73) Assignee; please replace "Qimonds AG" with --Qimonda AG--
Column 9, claim 8, line 13; please replace "said material" with --said sacrificial material--
Column 10, claim 22, line 56; please replace "in" with --of--

Signed and Sealed this

Seventeenth Day of February, 2009

JOHN DOLL
*Acting Director of the United States Patent and Trademark Office*